(12) United States Patent
Hirukawa et al.

(10) Patent No.: US 7,816,162 B2
(45) Date of Patent: Oct. 19, 2010

(54) SEMICONDUCTOR DEVICE MANUFACTURING METHOD

(75) Inventors: Shuichi Hirukawa, Kyoto (JP); Katsuhiko Kishimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/500,442

(22) Filed: Jul. 9, 2009

(65) Prior Publication Data

US 2009/0275160 A1    Nov. 5, 2009

Related U.S. Application Data

(62) Division of application No. 11/357,941, filed on Feb. 22, 2006, now Pat. No. 7,760,783.

(30) Foreign Application Priority Data

Feb. 23, 2005   (JP) ............... P2005-047087

(51) Int. Cl.
- *H01L 21/00* (2006.01)
- *H01L 21/461* (2006.01)
- *H01L 21/302* (2006.01)
- *H01L 21/311* (2006.01)

(52) U.S. Cl. ............... 438/39; 438/46; 438/689; 438/696; 438/717; 438/736; 438/738; 438/739; 438/740; 438/741; 257/E21.387; 257/E21.532

(58) Field of Classification Search ......... 257/E21.387, 257/E21.532
See application file for complete search history.

(56) References Cited

U.S. PATENT DOCUMENTS 5,539,239 A * 7/1996 Kawazu et al. ............... 257/94

2005/0152419 A1 * 7/2005 Kishimoto et al. ............ 372/43

(Continued)

FOREIGN PATENT DOCUMENTS

JP    04111375 A    4/1992

(Continued)

OTHER PUBLICATIONS

USPTO Office Action issued on U.S. Appl. No. 11/357,941, dated Jul. 6, 2007.

(Continued)

*Primary Examiner*—Savitri Mulpuri
*Assistant Examiner*—Mohsen Ahmadi
(74) *Attorney, Agent, or Firm*—Birch, Stewart, Kolasch & Birch, LLP

(57) ABSTRACT

After a p-type cladding layer, an etching rate reducing layer and a p-type contact layer are formed in order on an n-type substrate, an etching mask is formed. Then, by using the etching mask, the p-type contact layer, the etching rate reducing layer and the p-type cladding layer are partially etched in the region outside the etching mask with an etchant. At this time, the etching rate of the layers by the etchant is slower in the etching rate reducing layer than in the p-type cladding layer and the p-type contact layer. Then, a metal thin film is formed such that the film continuously coats an upper surface and side surfaces of a ridge consisting of the above layers left after the etching step. A normal vector at a surface coated with the thin film has an upward component.

4 Claims, 16 Drawing Sheets

U.S. PATENT DOCUMENTS

2005/0213628 A1* 9/2005 Kishimoto et al. ....... 372/46.01
2005/0271108 A1* 12/2005 Wada et al. .............. 372/50.12

FOREIGN PATENT DOCUMENTS

| JP | 2000-114660 A | 4/2000 |
|---|---|---|
| JP | 2003-100767 A | 4/2003 |
| JP | 2003-163414 A | 6/2003 |
| JP | 2004-22833 A | 1/2004 |

OTHER PUBLICATIONS

USPTO Office Action issued on U.S. Appl. No. 11/357,941, dated Oct. 17, 2007.

USPTO Office Action issued on U.S. Appl. No. 11/357,941, dated Jan. 17, 2008.

USPTO Office Action issued on U.S. Appl. No. 11/357,941, dated Jul. 3, 2008.

USPTO Office Action issued on U.S. Appl. No. 11/357,941, dated Oct. 24, 2008.

USPTO Office Action issued on U.S. Appl. No. 11/357,941, dated Nov. 5, 2008.

USPTO Office Action issued on U.S. Appl. No. 11/357,941, dated Dec. 1, 2008.

USPTO Office Action issued on U.S. Appl. No. 11/357,941, dated Mar. 6, 2009.

* cited by examiner

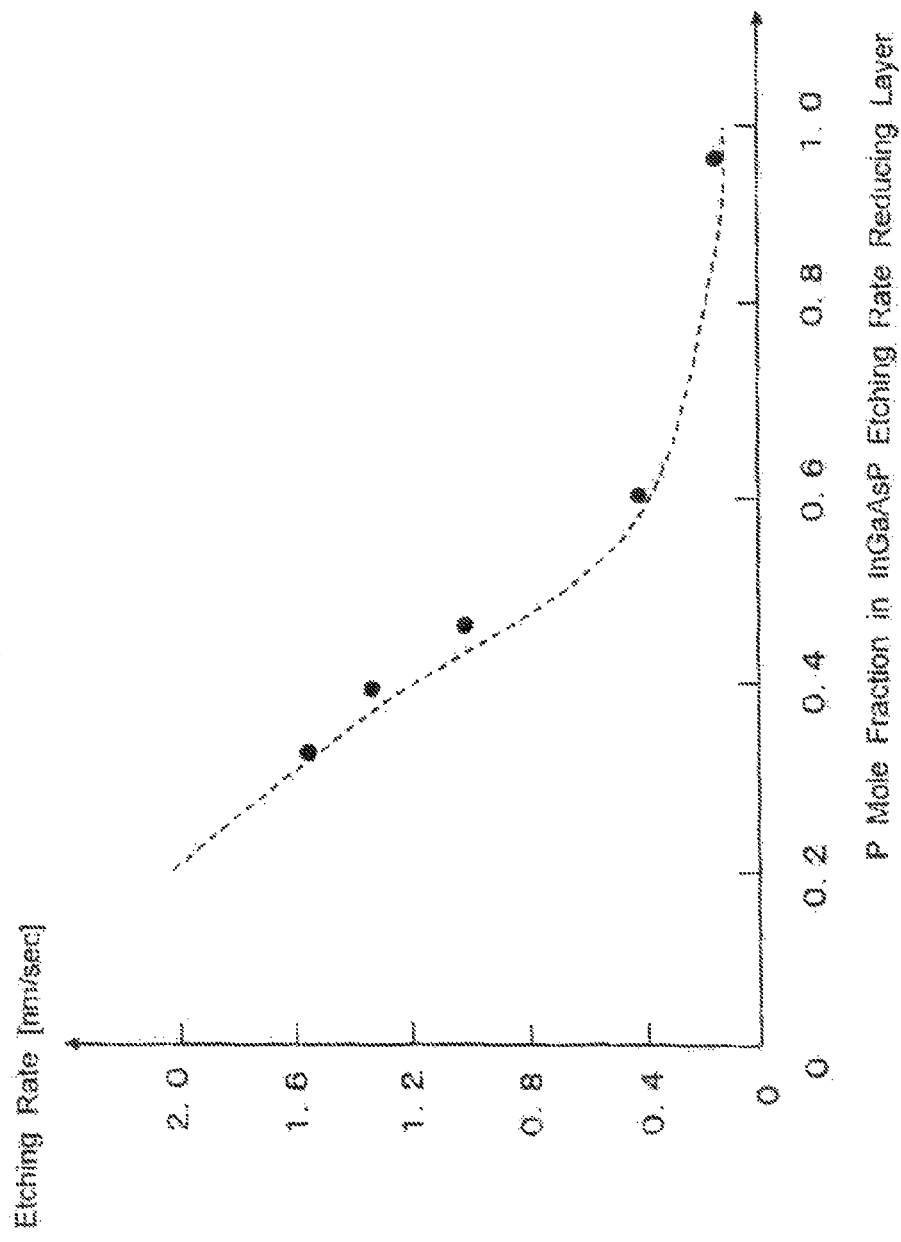

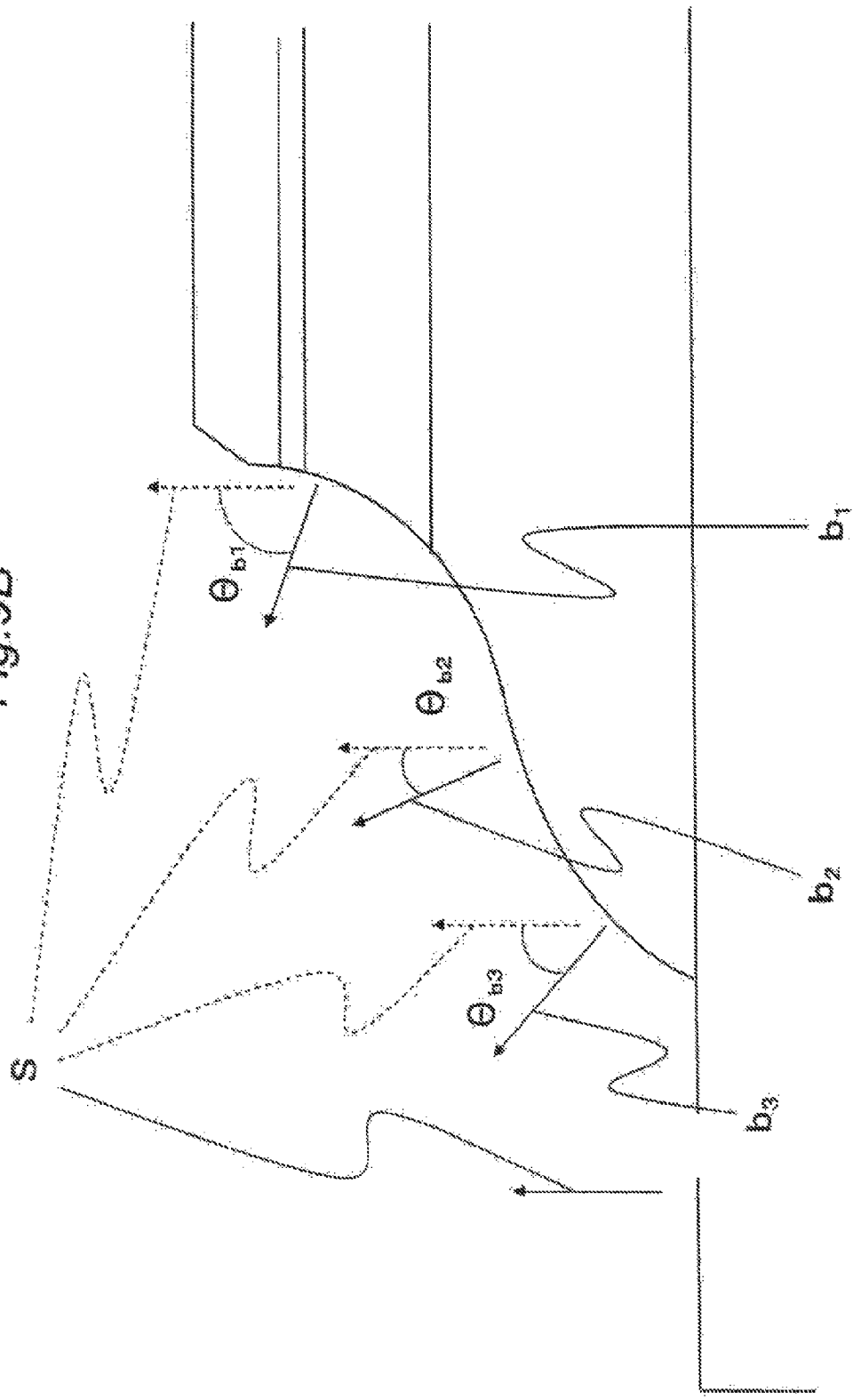

SEMICONDUCTOR DEVICE MANUFACTURING METHOD

This application is a Divisional Application of application Ser. No. 11/357,941 filed on Feb. 22, 2006 now U.S. Pat. No. 7,760,783, and for which priority is claimed under 35 U.S.C. §120; and this application claims priority of Application No. 2005-047087 filed in Japan on Feb. 23, 2005 under 35 U.S.C. §119; the entire contents of which are hereby incorporated by reference.

FIELD OF THE INVENTION

The present invention relates to semiconductor devices such as a semiconductor laser device and a manufacturing method therefor, and an optical transmission module and an optical disk unit employing the semiconductor laser device.

BACKGROUND OF THE INVENTION

In a semiconductor device having a quantum well structure, a transistor or the like, electrodes are arranged to inject a current into the semiconductor material and make an electric contact with the outside. Normally, in order to inject a current into a semiconductor microstructure, a scheme has been employed in which the electrode on the microstructure is extended to provide a wider electrode region and a metal wire is connected to the electrode region. For example, a wide electrode region for facilitating bonding of a metal wire or the like is secured by embedding a portion other than the current injection region in an insulating resin or a dielectric or a semiconductor layer of a conductive type different from that of the current injection region and extending an electrode from the current injection region to the embedment region. Moreover, since the current injection region is often formed by processing a semiconductor layer into a mesa shape, the embedment region also plays the role of canceling a difference in level, or surface unevenness, due to the mesa, thus facilitating the extension of the electrode.

As a prior art semiconductor device, there is, for example, a semiconductor laser device that emits laser light from its light-emitting layer. The semiconductor laser device (not shown) generally has a so-called buried ridge structure. More in detail, in the semiconductor laser device, its active layer is held between a lower cladding layer and an upper cladding layer. Then, a ridge stripe portion is formed on the upper cladding layer to inject a current into a stripe-shaped region of the active layer, and a current constriction layer is formed on both sides of the ridge stripe portion.

The buried ridge structure is fabricated as follows.

First, layers such as the lower cladding layer, the active layer, the upper cladding layer are formed on a substrate by carrying out a first semiconductor crystal growth process, and thereafter, the ridge-shaped stripe portion is formed by etching part of the semiconductor layer on the substrate.

Then, the current constriction layer is formed on both sides of the stripe portion by carrying out a second semiconductor crystal growth process.

Further, a contact layer is formed on both the stripe portion and the current constriction layer by carrying out a third semiconductor crystal growth process, so that the contact layer securely provides a wide region in which the electrode is to be formed.

As is apparent from the above, the buried ridge structure has a problem that the semiconductor crystal growth step needs to be carried out three times in total, and it is very difficult to achieve cost reduction.

A so-called air ridge structure, which solves the problem, is disclosed in JP 2000-114660 A. The air ridge structure is a structure capable of constricting the current by means of an insulator or the like and needs only one semiconductor crystal growth step.

A semiconductor laser device having the air ridge structure is fabricated as follows.

First, as shown in FIG. 13, an n-AlGaAs lower cladding layer 502, an i-AlGaAs lower light-confining layer 503, a quantum well active layer 504 including an InGaAs quantum well layer and a GaAsP quantum well layer, an i-AlGaAs upper light-confining layer 505, an AlGaAs layer for forming a p-AlGaAs upper cladding layer 506, and a GaAs layer for forming a p-GaAs contact layer 507 are successively formed on an n-GaAs substrate (wafer) 501 by the metal-organic chemical vapor deposition (MOCVD) method.

Then, by partially etching the AlGaAs layer for forming the p-AlGaAs upper cladding layer 506 and the GaAs layer for forming the p-GaAs contact layer 507 through a normal photolithography step and an etching step, a ridge-shaped stripe portion 511 is formed.

Next, the entire surface of the wafer is coated with $SiN_X$, and only the $SiN_X$ on the contact layer 507 is removed, forming an insulating overcoat 508 made of $SiN_X$. After the upper surface of the contact layer 507 is exposed, a p-side electrode 509 is formed on the contact layer 507 and the insulating overcoat 508.

Next, an n-side electrode 510 is attached to the back surface (namely, a surface opposite from the surface on which the semiconductor layers are formed) of the n-GaAs substrate 501.

Next, the entire wafer is cleaved to a resonator length, and a low reflection coating and a high reflection coating (not shown) are deposited respectively on the two exposed cleavage surfaces, completing the semiconductor laser device.

In the semiconductor device, since the stripe portion 511 has a minute width of about several micrometers, it is impossible to bond a metal wire used for current injection directly to only the upper surface of the stripe portion 511. Therefore, the upper surface of the con act layer 507 is exposed from the insulating overcoat 508, and the p-side electrode 509 is formed on the contact layer 507 and the insulating overcoat 508. It is noted that a region in which a metal wire (not shown) is to be bonded is secured on the insulating overcoat 508 to which the p-side electrode 509 is led from the stripe portion 511.

Moreover, as another prior art semiconductor device, there is a GaAs based heterojunction bipolar transistor disclosed in JP 2003-100767 A.

The GaAs based heterojunction bipolar transistor is fabricated as follows.

First, as shown in FIG. 14, an $n^+$-type GaAs subcollector layer 602, a GaAs layer for forming an n-type GaAs collector layer 603, a GaAs layer for forming a p type GaAs base layer 604, an AlGaAs layer for forming an n-type AlGaAs emitter layer 605, a GaAs layer for forming an $n^+$-type GaAs first emitter contact layer 606 and an InGaAs layer for forming an $n^+$-type InGaAs second emitter contact layer 607 are epitaxially grown successively on a semi-insulating GaAs substrate 601 by the MOCVD method.

Next, surfaces of the $p^+$-type GaAs base layer 604 and the $n^+$-type GaAs subcollector layer 602 are exposed by carrying out the well-known photolithography step and etching step.

Next, an emitter ohmic contact electrode 613 made of $WN_X$, a base ohmic contact electrode 612 made of Pt/Ti/Pt/Au, and a collector ohmic contact electrode 611 made of AuGe/Ni/Au are formed on the $n^+$-type InGaAs second emitter contact layer 607, the p+-type GaAs base layer 604, and the n+-type GaAs subcollector layer 602, respectively, by sputtering and a vapor deposition method. Subsequently, an alloying step is carried out to obtain an ohmic connection between the p+-type GaAs base layer 604 and the n-type GaAs collector layer 603.

Next, an intermediate metal film 615 made of Ti/Pt/Au is formed on the base ohmic contact electrode 612, and an intermediate metal film 616 made of Ti/Pt/Au is formed on the emitter ohmic contact electrode 613.

Next, in order to cancel steps, or unevenness, formed of the n+-type GaAs subcollector layer 602, the n-type GaAs collector layer 603, the p+-type GaAs base layer 604, the n-type AlGaAs emitter layer 605, the n+-type GaAs first emitter contact layer 606 and the n+-type InGaAs second emitter contact layer 607, a thermosetting resin 620 is placed. A photosensitive polyimide is used as a material of the thermosetting resin 620.

A method of placing the thermosetting resin 620 will be described in concrete below. A polyimide precursor diluted with a solvent is applied onto the GaAs substrate 601 by a spin coating method, and the polyimide precursor is formed into a desired pattern by subjecting the polyimide precursor to exposure to light and development. Then, heat treatment is performed to make the polyimide precursor a polyimide to thereby obtain the thermosetting resin 620. The thermosetting resin 620 is designed to avoid its overlapping with a region where the collector ohmic contact electrode 611 is formed as much as possible.

Next, an intermediate metal film 621 made of Ti/Pt/Au is formed on the collector ohmic contact electrode 611, and wiring metal electrodes 618 and 619 to the respective ohmic connection electrodes are subsequently formed, completing the heterojunction bipolar transistor.

In the heterojunction bipolar transistor, the wiring metal electrode 618 led from the intermediate metal film 616 on the emitter ohmic contact electrode 613 and the wiring metal electrode 619 led from the intermediate metal film 615 on the base ohmic contact electrode 612 are led from an upper part of the mesa-shaped semiconductor portion. Therefore, in order to prevent the breaking of the wires due to the steps of the semiconductor layers, the wires are formed on the thermosetting resin 620 in which the steps of the semiconductor layers are embedded.

Generally, in such a heterojunction bipolar transistor, the mesa-shaped semiconductor portion has a rectangular shape when viewed from above in order to reduce the base-emitter junction area and reduce the base resistance, and the mesa side surface parallel to the lengthwise direction of the rectangular shape has an inverted taper shape as shown in FIG. 14. Further, in order to reduce the cost of the bipolar transistor, the chip area of the transistor needs to be reduced and the electrodes must be extended as if they stride over the mesa side surfaces when led from the upper part of the mesa-shaped semiconductor portion. From this point of view as well, the embedment with a thermosetting resin is important.

However, breaking, or discontinuity, induced by a step (referred to as "step-induced breaking" or "step-induced discontinuity") tends to occur in the deposited insulating overcoat and the p-electrode of the semiconductor laser device of FIG. 13, and this disadvantageously makes the fabrication of the semiconductor laser device difficult and thus lowers the yield.

Moreover, the transistor of FIG. 14 needs a process for forming an insulating substance such as a resin on the sides of the mesa-shaped semiconductor layers in order to draw the electrode from the upper part of the mesa-shaped semiconductor portion without causing the step-induced breaking, and this therefore causes a problem of an increased number of manufacturing process steps, a reduction in the yield, an increase in the cost, and so on.

SUMMARY OF THE INVENTION

An object of the present invention is to provide a semiconductor device and a manufacturing method therefor, an optical transmission module, and an optical disk unit that enable the improvement in the yield and thus the reduction in the manufacturing cost.

In order to accomplish the above object, there is provided, according to an aspect of the present invention, a semiconductor device manufacturing method comprising:

a first semiconductor layer forming step forming on a semiconductor substrate a first semiconductor layer that has an etching rate;

a second semiconductor layer forming step forming on the first semiconductor layer a second semiconductor layer that has an etching rate slower than the etching rate of the first semiconductor layer;

a third semiconductor layer forming step forming on the second semiconductor layer a third semiconductor layer that has an etching rate faster than the etching rate of the second semiconductor layer;

an etching mask forming step forming an etching mask on the third semiconductor layer;

an etching step etching, by using the etching mask and an etchant, the third semiconductor layer, the second semiconductor layer and the first semiconductor layer in a region outside the etching mask; and a thin film forming step forming a thin film such that the thin film continuously coats an upper surface and side surfaces of a semiconductor layer group that includes the third semiconductor layer, the second semiconductor layer and the first semiconductor layer remaining after the etching step.

The "thin film" herein means a thin film that is sufficiently thinner than the height of a step, namely a difference in level, formed by the etching.

With the semiconductor device manufacturing method of the construction, after the first semiconductor layer, the second semiconductor layer and the third semiconductor layer are formed on the semiconductor substrate, the etching mask is formed on the third semiconductor layer. Then, the third semiconductor layer, the second semiconductor layer and the first semiconductor layer are partially etched in the region outside the etching mask with an etchant by using the etching mask. At this time, the third semiconductor layer is first etched, and the second semiconductor layer is exposed. Then, since the etching rate of the second semiconductor layer is slow, the etching of a side portion of the third semiconductor layer progresses while the second semiconductor layer is being etched. Then, when the second semiconductor layer has been etched until the first semiconductor layer is exposed, the etching of the first semiconductor layer almost similar to the etching of the third semiconductor layer progresses since the etching rate of the first semiconductor layer is fast. As a result, the side surfaces of the third semiconductor layer to the first semiconductor layer exposed by the etching come to have a shape that has neither an eave nor a rise perpendicular to the substrate. That is, the normal vector on the surface exposed by the etching of the semiconductor layer group, constructed of the third semiconductor layer, the second semiconductor layer and the first semiconductor layer, left with the etching mask has an upward component. The term "upward" herein means the direction in which the semiconductor layers are stacked on the substrate surface.

The etching of the semiconductor layer group can be achieved by one-time etching step using an etchant of one kind and without changing the etchant partway. Therefore, the manufacturing cost of the semiconductor device can be reduced.

Moreover, although the thin film is formed so as to coat a region from the upper surface of the semiconductor layer group, more specifically, of the third semiconductor layer to the side surface of the semiconductor layer group, the thin film is prevented from suffering from the so-called step-induced breaking or discontinuity. Therefore, the thin film extends continuously on the third semiconductor layer to the side portion of the first semiconductor layer without a step-induced breaking. Therefore, the yield of the semiconductor device is improved, and the manufacturing cost of the semiconductor device can be reduced.

In one embodiment, the first semiconductor layer and the third semiconductor layer are each comprised of any one of AlGaAs, GaAs and InGaAs, and the second semiconductor layer is comprised of InGaAsP or GaAsP. A P mole fraction in Group V elements in the second semiconductor layer is larger than 0.2 but smaller than 0.6. And, the etchant is a mixture aqueous solution of sulfuric acid and a hydrogen peroxide solution.

In this embodiment, because the second semiconductor layer contains P, and the first and third semiconductor layers do not contain P, use of the mixture aqueous solution of sulfuric acid and the hydrogen peroxide solution as an etchant for the third, second and first semiconductor layers ensures and facilitates the reduction of the etching rate of the second semiconductor layer such that it is slower than the etching rates of the first and third semiconductor layers. Therefore, it is possible to easily achieve a shape of the semiconductor layer group that allows the formation of a continuous thin film from on the third semiconductor layer to the side portion of the first semiconductor layer without causing step-induced breaking of the thin film, with good controllability. As a result, the yield of the semiconductor device is improved, and the manufacturing cost of the semiconductor device is reduced.

Moreover, since the second semiconductor layer is made of InGaAsP or GaAsP, the etching rate in the direction toward the substrate can suitably be reduced between the third semiconductor layer and the first semiconductor layer.

Moreover, since the P mole fraction in the Group V elements of the second semiconductor layer is greater than 0.2 but smaller than 0.6, the etching rate is suitably reduced at the second semiconductor layer, and the etching of the third semiconductor layer moderately progresses while the second semiconductor layer is being etched. Moreover, particularly due to the fact that the P mole fraction in the Group V elements is smaller than 0.6, the second semiconductor layer is prevented from being unable to be etched due to an excessive reduction in the etching rate. Therefore, the yield of the semiconductor device is improved, and the manufacturing cost of the semiconductor device is reduced.

In one embodiment, the semiconductor device manufacturing method further includes a fourth semiconductor layer forming step forming on the semiconductor substrate a fourth semiconductor layer of a second conductive type whose doping concentration is not higher than $1 \times 10^{17}$ cm$^{-3}$ prior to the first semiconductor layer forming step. The semiconductor substrate has a first conductive type, the first and third semiconductor layers have the second conductive type. The third semiconductor layer has a doping concentration of not lower than $1 \times 10^{18}$ cm$^{-3}$. The fourth semiconductor layer is exposed at least in a partial region through the etching step. The thin film is an electrode, and the thin film is additionally formed on the fourth semiconductor layer as well. The semiconductor device manufacturing method further includes a compound layer forming step subjecting the electrode to heat treatment after the thin film forming step to form at an interface between the electrode and the third semiconductor layer a heavily-doped side compound layer comprised of at least one of constituent elements of the electrode and at least one of constituent elements of the third semiconductor layer and form at an interface between the electrode and the fourth semiconductor layer a lightly-doped side compound layer comprised of at least one of the constituent elements of the electrode and at least one of constituent elements of the fourth semiconductor layer.

The "first conductive type" herein means a p-type or an n-type. Moreover, the "second conductive type" means the n-type when the first conductive type is the p-type or the p-type when the first conductive type is the n-type.

In this embodiment, since the heavily-doped side compound layer constructed of at least one of the constituent elements of the electrode and at least one of the constituent elements of the third semiconductor layer whose doping concentration is not lower than $1 \times 10^{18}$ cm$^{-3}$ is formed at the interface between the electrode and the third semiconductor layer by carrying out the compound layer forming step after the thin film forming step, a low contact resistance is obtained at the ohmic junction between the electrode and the third semiconductor layer.

Moreover, since the lightly-doped side compound layer constructed of at least one of the constituent elements of the electrode and at least one of the constituent elements of the fourth semiconductor layer whose doping concentration is not higher than $1 \times 10^{17}$ cm$^{-3}$ is formed at the interface between the electrode and the fourth semiconductor layer by carrying out the compound layer forming step after the thin film forming step, sufficient current constriction is obtained at the Schottky junction between the electrode and the fourth semiconductor layer.

As described above, the electrode is produced on the semiconductors having a step obtained through one-time etching such that the electrode provides a continuous coating of the semiconductors from the top of the step to the side surfaces and then to the lateral sides of the step. In addition, such an electrode is produced such that a sufficiently low contact resistance at the upper part of the step and a sufficient current constriction property in the side portion of the step can be concurrently obtained. Therefore, a structure capable of injecting a current into a desired region of the semiconductor device and a wider electrode region for electric contact with the outside can simply be obtained without separately forming an insulator or a current constriction layer, and the manufacturing cost of the semiconductor device can consequently be reduced.

Also, there is provided, according to another aspect of the present invention, a semiconductor laser device including:

a semiconductor substrate;

a semiconductor layer group on the semiconductor substrate, the semiconductor layer group including a first semiconductor layer, a second semiconductor layer and a third semiconductor layer that are formed in order from the substrate side; and a thin film continuously coating an upper surface and side surfaces of the semiconductor layer group, wherein the second semiconductor layer has an etching rate slower than etching rates of the first and third semiconductor layers, and wherein a normal vector on a surface coated with the thin film of the semiconductor layer group has an upward component.

The "thin film" herein means a thin film that is sufficiently thinner than the height of the step formed by the etching.

With the above construction, because the second semiconductor layer has an etching rate slower than the etching rates of the first and third semiconductor layers, there is an effect of reducing the rate of etching in the direction toward the semiconductor substrate between the third semiconductor layer and the first semiconductor layer. Therefore, taking advantage of the isotropy of the etching of the third, second and first semiconductor layers with the etchant and performing the etching of the third semiconductor layer for a longer time achieves the semiconductor layer group of a favorable shape. Moreover, the normal vector on the surface exposed by the etching of the semiconductor layer group is allowed to have an upward component. With this arrangement, the so-called step-induced breaking is prevented from occurring in the thin film that is formed as the continuous coating over the side surfaces of the third semiconductor layer, the second semiconductor layer and the first semiconductor layer and that extends from the upper surface of the third semiconductor layer to the lateral sides of the semiconductor layer group. Therefore, a semiconductor device of which the yield is improved and the manufacturing cost is reduced is obtained. The term "upward" herein means the direction in which the semiconductor layers are stacked on the substrate surface.

In one embodiment, the thin film is a conductive thin film or there is a conductive thin film on the thin film, and the normal vector on the surface coated with the thin film of the semiconductor layer group has an upward component in at least one path that connects one point on the conductive thin film located on a side opposite from the substrate with respect to the second semiconductor layer with one point on the conductive thin film located on the same side as the substrate with respect to the second semiconductor layer.

In the semiconductor device of the embodiment, the conductive thin film can be continuously arranged in the path without undergoing the step-induced breaking, and electric continuity using the path is reliably secured. Therefore, a semiconductor device of which the yield is improved and the manufacturing cost is reduced is obtained.

In one embodiment, the second semiconductor layer is comprised of InGaAsP or GaAsP, a P mole fraction in Group V elements of the second semiconductor layer is larger than 0.2 but smaller than 0.6, and the first and third layers are each comprised of any one of AlGaAs, GaAs and InGaAs.

According to the semiconductor device of the embodiment, when the third semiconductor layer, the second semiconductor layer and the first semiconductor layer are formed with an etchant of one kind, since the second semiconductor layer is made of InGaAsP or GaAsP and the third and first semiconductor layers are each made of any one of AlGaAs, GaAs and InGaAs, the etching rate of the second semiconductor layer can reliably and easily be made slower than the etching rates of the third semiconductor layer and the first semiconductor layer. Therefore, a semiconductor device of which the yield is improved and the manufacturing cost is reduced is obtained.

Moreover, the P mole fraction in the Group V elements in the second semiconductor layer is greater than 0.2 and smaller than 0.6, the second semiconductor layer moderately reduces its etching rate with respect to the etching rate of the third semiconductor layer and the first semiconductor layer. Therefore, it is possible to avoid the over-etching of the third semiconductor layer due to an excessive reduction in the etching rate of the second semiconductor layer and the obtainment of a third semiconductor layer that causes a step-induced breaking in the subsequently formed thin film due to an insufficient reduction in the etching rate of the second semiconductor layer. Therefore, a semiconductor device of which the yield is improved and the manufacturing cost is reduced is obtained.

In one embodiment, the semiconductor device is a semiconductor laser device. And, the semiconductor substrate is comprised of a group III-V compound semiconductor of a first conductive type. Also, the first semiconductor layer is an upper cladding layer comprised of a group III-V compound semiconductor of a second conductive type, the third semiconductor layer is a contact layer comprised of a group III-V compound semiconductor of the second conductive type, the second semiconductor layer is an etching rate reducing layer that is comprised of a group III-V compound semiconductor. The etching rate reducing layer is comprised of InGaAsP or GaAsP, a P mole fraction in the Group V elements of the etching rate reducing layer is greater than 0.2 and smaller than 0.6, and the upper cladding layer and the contact layer are each comprised of any one of AlGaAs, GaAs and InGaAs. The semiconductor laser device further includes a lower cladding layer that is formed between the semiconductor substrate and the upper cladding layer and is comprised of a group III-V compound semiconductor of the first conductive type, and an active layer that is formed between the lower cladding layer and the upper cladding layer and is comprised of a group III-V compound semiconductor. And, at least the upper cladding layer, the etching rate reducing layer and the contact layer constitute a ridge-shaped stripe portion.

The "first conductive type" herein means the p-type or the n-type. Moreover, the "second conductive type" means the n-type when the first conductive type is the p-type or the p-type when the first conductive type is the n-type.

The above construction achieves the thin film that continuously extends from the contact layer located at the top of the ridge-shaped stripe portion to the side surface of the ridge-shaped stripe portion without undergoing the step-induced breaking. Thus, a low-cost semiconductor laser device of which the yield is improved can be obtained.

Moreover, the ridge-shaped stripe portion can be formed through one-time etching step with an etchant of one kind. Therefore, a semiconductor laser device of which the manufacturing cost is further reduced is obtained.

In one embodiment, the semiconductor laser device further includes a ridge lower layer that is formed between the upper cladding layer and the active layer and that is comprised of a group III-V compound semiconductor of the second conductive type. And, the stripe portion is formed on the ridge lower layer, the thin film is an electrode that continuously covers from the side surface of the contact layer to at least a partial region on the ridge lower layer, and current constriction to the stripe portion is effected by a Schottky junction between the electrode and the ridge lower layer.

According to the semiconductor laser device of the embodiment, current constriction to the stripe portion (namely, narrowing down the current to the stripe portion so that the current does not flow in areas other than the stripe portion) is effected by the Schottky junction between the electrode and the ridge lower layer. Therefore, it is not required to form an insulating layer of silicon nitride ($SiN_X$ (X: positive number)), silicon oxide ($SiO_2$) or the like between the electrode and the ridge lower layer. Therefore, a semiconductor laser device of which the manufacturing cost is reduced is obtained.

Moreover, the structure for effecting the current constriction can be formed through one-time crystal growth. Therefore, a semiconductor laser device, of which the manufacturing cost is reduced further than in the buried ridge type that needs crystal growth three times, s obtained as the semiconductor device.

In one embodiment, the contact layer has a doping concentration of not lower than $1 \times 10^{18}$ cm$^{-3}$, and the ridge lower layer has a doping concentration of not higher than $1 \times 10^{17}$ cm$^{-3}$. Also, a heavily-doped side compound layer comprised of at least one of constituent elements of the electrode and at least one of constituent elements of the contact layer is formed at an interface between the electrode and the contact layer, and a lightly-doped side compound layer comprised of at least one of the constituent elements of the electrode and at least one of constituent elements of the ridge lower layer is formed at an interface between the electrode and the ridge lower layer.

In the semiconductor laser device of the embodiment, the heavily-doped side compound layer constituted of at least one of the constituent elements of the electrode and at least one of the constituent elements of the contact layer whose doping concentration is not lower than $1 \times 10^{18}$ cm$^{-3}$ is formed at the interface between the electrode and the contact layer. Therefore, a low contact resistance is obtained at the ohmic junction between the electrode and the contact layer.

Moreover, the lightly-doped side compound layer constituted of at least one of the constituent elements of the electrode and at least one of the constituent elements of the ridge lower layer whose doping concentration is not higher than $1 \times 10^{17}$ cm$^{-3}$ is formed at the interface between the electrode and the ridge lower layer. Therefore, sufficient current constriction is obtained by the Schottky junctions between the electrode and the ridge lower layer.

As described above, the electrode that provides a continuous coating of the semiconductors from the top of a step, obtained through one-time etching, to the side surfaces and then to the lateral sides of the step is produced such that a sufficiently low contact resistance at the upper part of the step and a sufficient current constriction property in the side portion of the step can be concurrently obtained. Thus, the manufacturing cost of the semiconductor laser device can be reduced.

In one embodiment, the ridge lower layer includes a plurality of layers comprised of group III-V compound semiconductors of different compositions, and of the layers of the ridge lower layer, at least an uppermost layer contains P of which a mole fraction is not smaller than 0.6.

According to the semiconductor laser device of the embodiment, since the P mole fraction of the uppermost layer of the layers that constitute the ridge lower layer is not smaller than 0.6, the etching for forming the stripe portion almost stops at the ridge lower layer. Thus, it is possible to obtain a semiconductor laser device in which the width of the stripe portion can be produced with good control and of which the yield is reduced and the manufacturing cost is reduced.

In one embodiment, a lowermost layer of the electrode comprises Ti or Pt.

According to the semiconductor laser device of the embodiment, since the material of the lowermost layer of the electrode is Ti or Pt, an electrode of a thinner film can be formed by virtue of sufficient adhesion to the side surface of the ridge-shaped stripe portion exposed by the etching. Therefore, a low-cost semiconductor laser device is obtained by reducing the consumption of the material of the electrode, and the heavily-doped side compound layer and the lightly-doped side compound layer capable of making compatible the sufficient current constriction property and the sufficiently low contact resistance can be formed at the same time.

An optical transmission module according to the present invention includes the above-described semiconductor laser device of the invention.

The optical transmission module provides an effect of remarkably suppressing the module unit price by employing the semiconductor laser device with the above-described construction.

Also, an optical disk unit according to the present invention includes the above-described semiconductor laser device of the invention.

The optical disk unit provides an effect of remarkably suppressing the module unit price by employing the semiconductor laser device with the above-described construction.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 8 is a graph showing a relation between the etching rate of an etching rate reducing layer made of InGaAsP and a P mole fraction in Group V elements in the etching rate reducing layer;

FIG. 9B is a schematic view showing normal vectors on a surface exposed by etching;

DETAILED DESCRIPTION OF THE INVENTION

Figure 1:
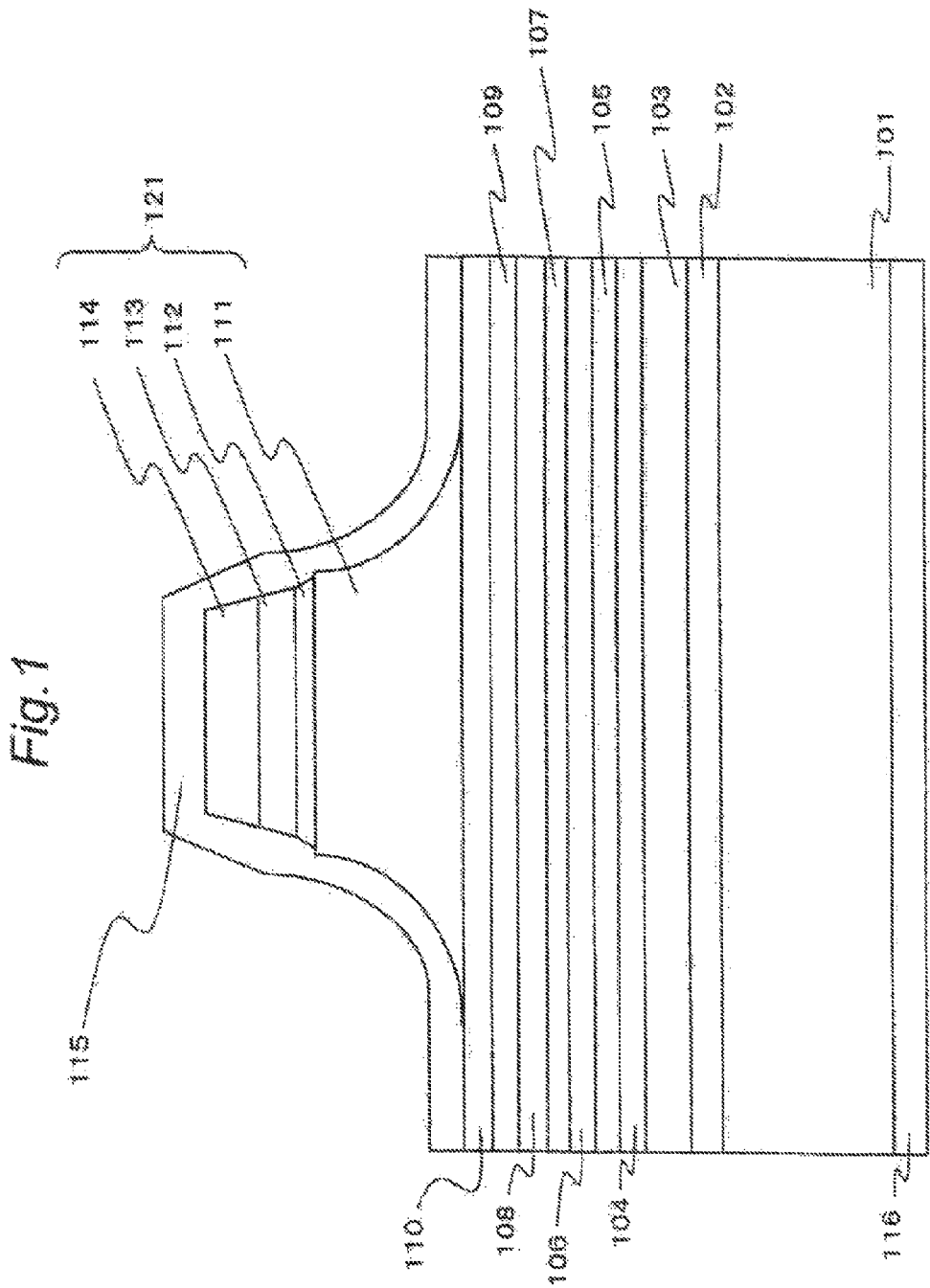
FIG. 1 is a schematic sectional view of a semiconductor laser device according to a first embodiment of the present invention.

The present invention will be described in detail below based on the embodiments shown in the drawings. A semiconductor laser device will be taken below as one example of the semiconductor device.

First Embodiment

FIG. 1 shows a schematic sectional view of the semiconductor laser device of the first embodiment of the present invention. The schematic cross section shown is a cross section perpendicular to the stripe direction. It is noted that the first conductive type is an n-type, hereinafter expressed as "n–", and the second conductive type is a p-type, hereinafter expressed as "p–", in the first embodiment.

The semiconductor laser device has an n-GaAs buffer layer 102, an n-$Al_{0.5}Ga_{0.5}As$ first lower cladding layer 103, an n-$Al_{0.422}Ga_{0.578}As$ second lower cladding layer 104, an $Al_{0.25}Ga_{0.75}As$ lower guide layer 105, a multiple strained quantum well active layer 106, an $Al_{0.4}Ga_{0.6}As$ upper guide layer 107, a p-$Al_{0.55}Ga_{0.442}As$ first upper cladding layer lower layer 108, a p-$Al_{0.558}Ga_{0442}As$ first upper cladding layer upper layer 109 and a p-$In_{0.34}Ga_{0.66}As_{0.3}P_{0.7}$ etching stop layer 110 on an n-GaAs substrate 101.

A ridge-shaped mesa stripe portion 121 is formed on the etching stop layer 110. The mesa stripe portion 121 is constructed of a p-$Al_{0.5}Ga_{0.5}As$ second upper cladding layer 111, an $In_{0.25}Ga_{0.75}As_{0.54}P_{0.46}$ etching rate reducing layer 117, a p-GaAs first contact layer 113 and a p$^{++}$-GaAs second contact layer 114. A cross section perpendicular to the stripe direction of the mesa stripe portion 121 has a regular mesa shape (namely, the upper part is narrower than the lower part). The layers that constitute the mesa stripe portion 121 also have a regular mesa shape.

A p-side electrode 115 is formed on the stripe portion 121 and the etching stop layer 110.

An n-side electrode 116 is formed on the back of the n-GaAs substrate 101.

The n-GaAs substrate 101 serves as one example of the semiconductor substrate; the n-$Al_{0.1}Ga_{0.5}As$ first lower cladding layer 103 and the n-$Al_{0.42}Ga_{0.578}As$ second lower cladding layer 104 serve as one example of the lower cladding layer; the multiple strained quantum well active layer 106 serves as one example of the active layer; the p-$In_{0.34}Ga_{0.66}As_{0.3}P_{0.7}$ etching stop layer 110 serves as one example of the fourth semiconductor layer; the p-$Al_{0.5}Ga_{0.5}As$ second upper cladding layer 111 serves as one example of the first semiconductor layer and also as one example of the upper cladding layer; the $In_{0.25}Ga_{0.75}As_{0.54}P_{0.46}$ etching rate reducing layer 112 serves as one example of the second semiconductor layer and also as one example of the etching rate reducing layer; the p-GaAs first contact layer 113 and the p$^{++}$-GaAs second contact layer 114 serve as one example of the third semiconductor layer and also as one example of the contact layer; the p-$Al_{0.558}Ga_{0.442}As$ first upper cladding layer lower layer 108 and the p-$In_{0.34}Ga_{0.66}As_{0.3}P_{0.7}$ etching stop layer 110 serve as one example of the ridge lower layer; and the p-side electrode 115 serves as one example of the thin film.

A method for manufacturing the semiconductor laser structure will be described below with reference to FIGS. 2 through 5. Although actually the semiconductor laser device is fabricated wafer by wafer, FIGS. 2-5 show one chip only for the sake of simplicity of the drawings.

Figure 2:
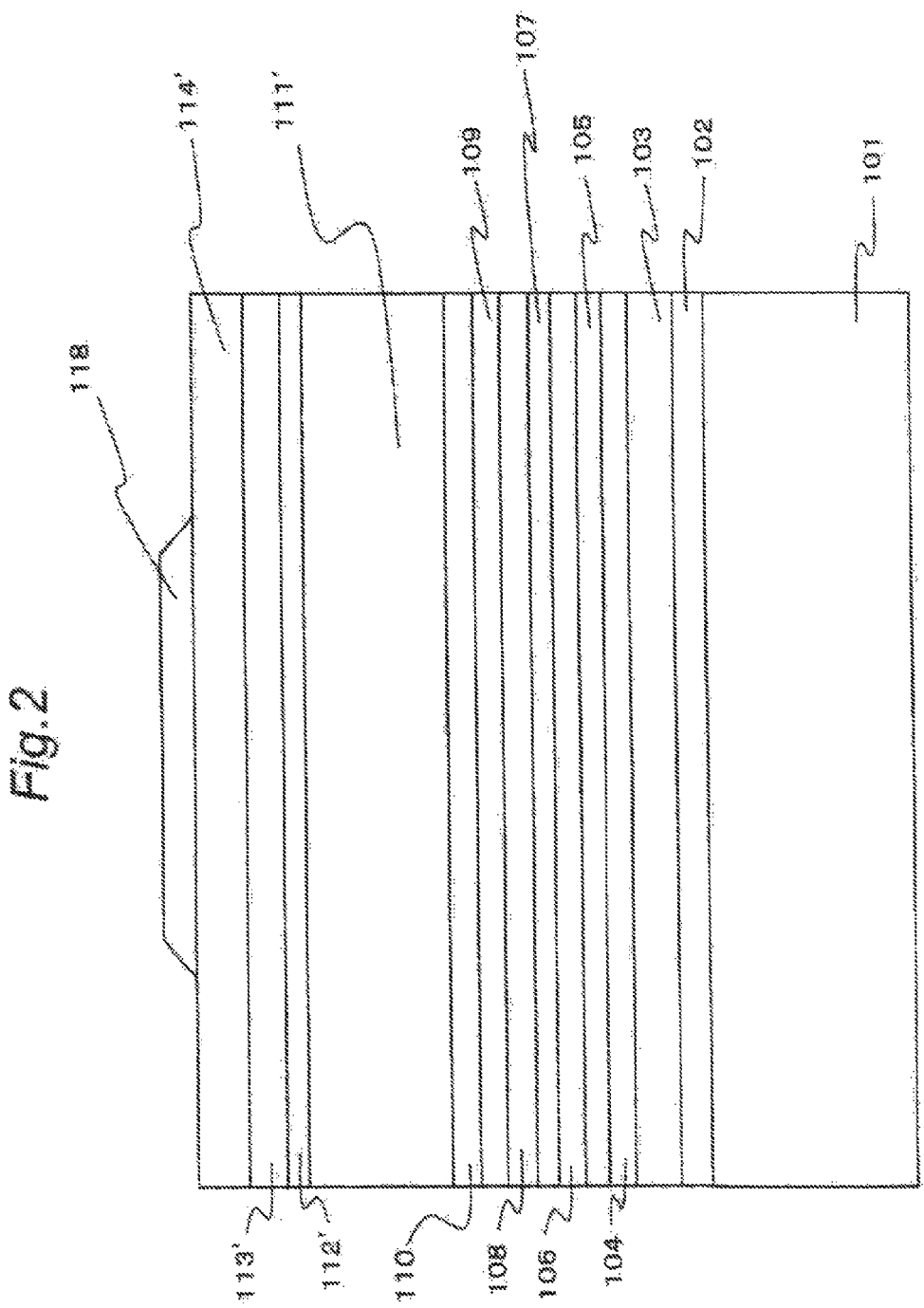
FIGS. 2 through 5 are process charts illustrating a method for manufacturing the semiconductor laser device of the first embodiment.

First, as shown in FIG. 2, an n-GaAs buffer layer 102 (layer thickness: 0.5 μm), an n-$Al_{0.5}Ga_{0.5}As$ first lower cladding layer 103 (layer thickness: 2 μm), an n-$Al_{0.422}Ga_{0.578}As$ second lower cladding layer 104 (layer thickness: 0.1 μm), an $Al_{0.25}Ga_{0.75}As$ lower guide layer 105 (layer thickness: 3 nm), a multiple strained quantum well active layer 106, an $Al_{0.4}Ga_{0.6}As$ upper guide layer 107 (layer thickness: 0.1 μm), a p-$Al_{0.558}Ga_{0.442}As$ first upper cladding layer lower layer 108 (layer thickness: 0.2 μm, doping concentration: 1.35× $10^{18}$ cm$^{-3}$), a p-$Al_{0.558}Ga_{0.442}As$ first upper cladding layer upper layer 109 (layer thickness: 0.1 μm, doping concentration: 1.0×$10^{17}$ cm$^{-3}$), a p-$In_{0.34}Ga_{0.66}As_{0.3}P_{0.7}$ etching stop layer 110 (layer thickness: 15 nm, doping concentration: 1.0×$10^{17}$ cm$^{-3}$), a p-$Al_{0.5}Ga_{0.5}As$ second upper cladding layer 111' (layer thickness: 1.28 μm), an $In_{0.25}Ga_{0.75}As_{0.54}P_{0.46}$ etching rate reducing layer 112' (layer thickness: 20 nm), a p-GaAs first contact layer 113' (layer thickness: 0.2 μm, doping concentration: 3.3×$10^{18}$ cm$^{-3}$) and a p$^{++}$-GaAs second contact layer 114' (layer thickness: 0.3 μm, doping concentration: 1.0×$10^{21}$ cm$^{-3}$) are successively crystal-grown on an n-GaAs substrate (wafer) 101 that has a (100) plane by the metal-organic chemical vapor deposition (MOCVD) method.

The multiple strained quantum well active layer 106 serves as one example of the active layer; the etching stop layer 110 serves as one example of the fourth semiconductor layer; the second upper cladding layer 111' serves as one example of the first semiconductor layer; the etching rate reducing layer 112, serves as one example of the second semiconductor layer; and the first contact layer 113' and the second contact layer 114' serve as one example of the third semiconductor layer.

The multiple strained quantum well active layer 106 is constituted by alternately arranging $In_{0.1001}Ga_{0.8999}As$ compressive strained quantum well layers (strain: +0.7%) and $In_{0.238}Ga_{0.762}As_{0.5462}P_{0.4537}$ barrier layers.

In the multiple strained quantum well active layer 106, there are two compressive strained quantum well layers, and each of the two layers has a layer thickness of 4.6 nm. On the other hand, there are three barrier layers, and these layers have their respective layer thicknesses of 21.5 nm, 7.9 nm and 21.5 nm from the n-GaAs substrate 101 side.

Note that the amount of strain of the well layer is expressed as $(a_1 - a_{GaAs})/a_{GaAs}$, where $a_{GaAs}$ is a lattice constant of the GaAs substrate, and $a_1$ is a lattice constant of the well layer. Thus, the well layer has a compressive strain when the value of $(a_1 - a_{GaAs})/a_{GaAs}$ is positive, and the well layer has a tensile strain when the value is negative.

Next, a resist mask 118 (mask width: 4 μm) of a stripe pattern extending in a (01-1) direction is produced through a photolithographic process at a portion at which the mesa stripe portion 121 is to be formed.

Next, the mesa stripe portion 121 is formed by partially etching the second upper cladding layer 111', the etching rate reducing layer 112', the first contact layer 113' and the second contact layer 114' by using the resist mask portion 118.

Figure 3:
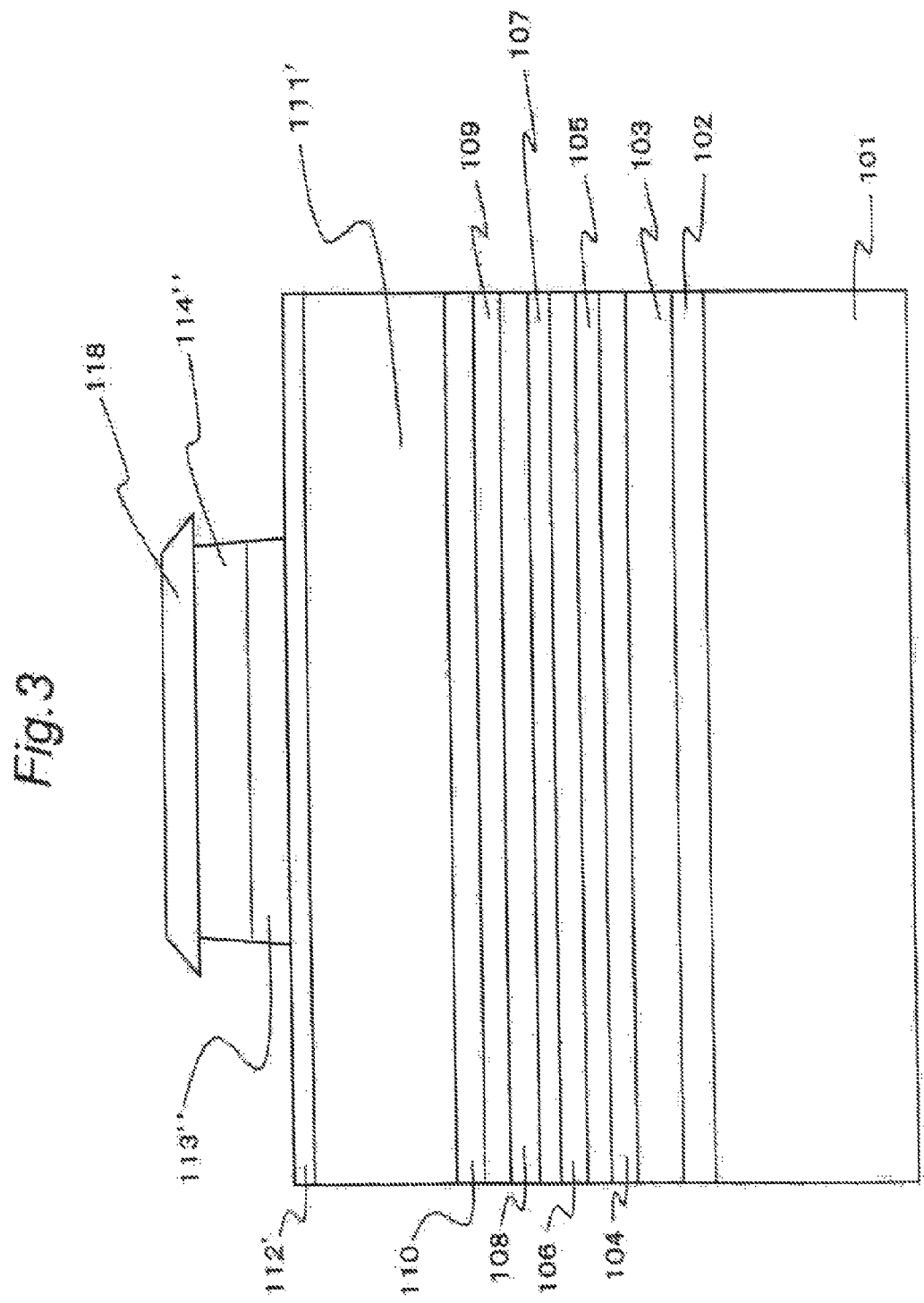
Figure 4:
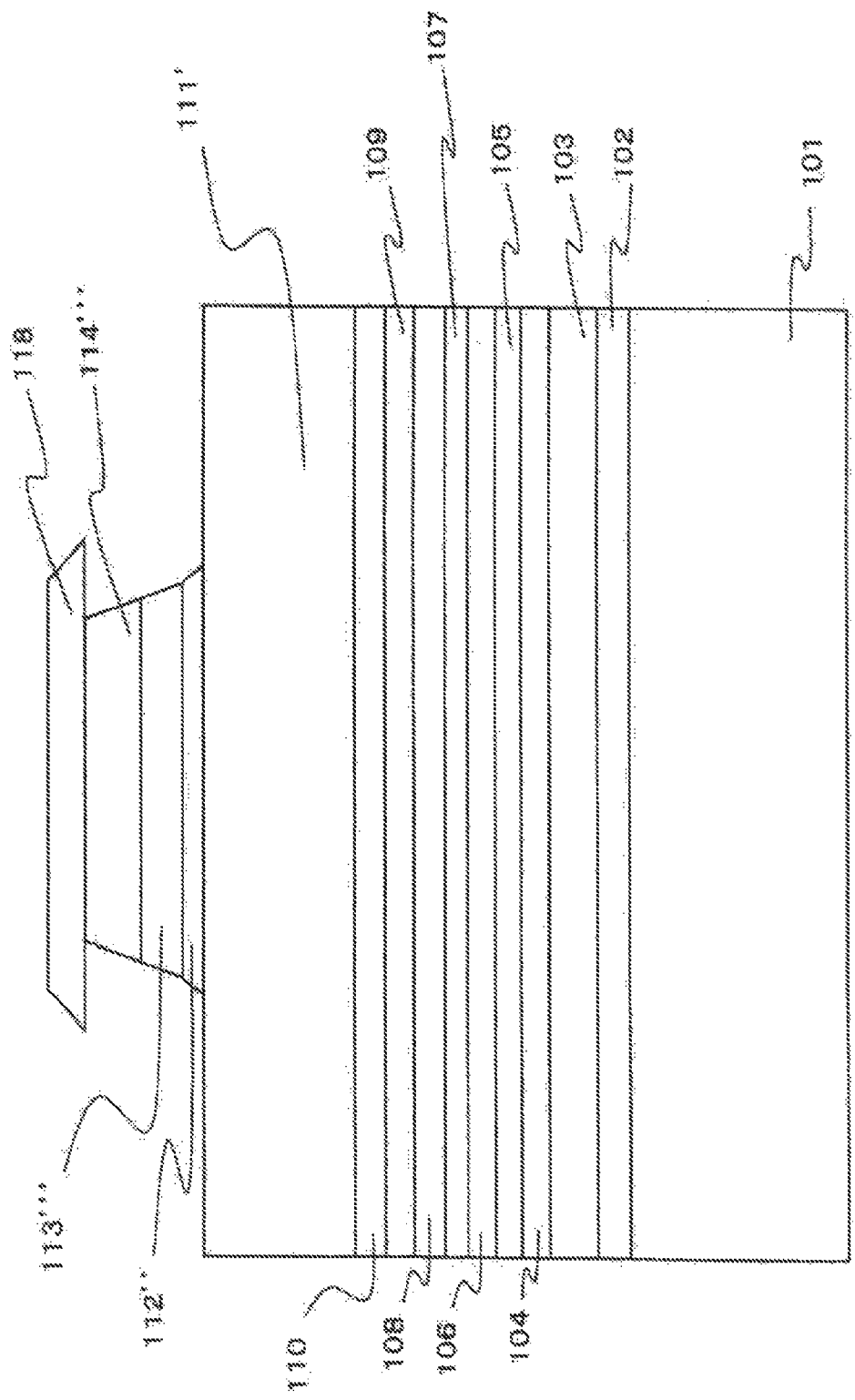
Figure 5:
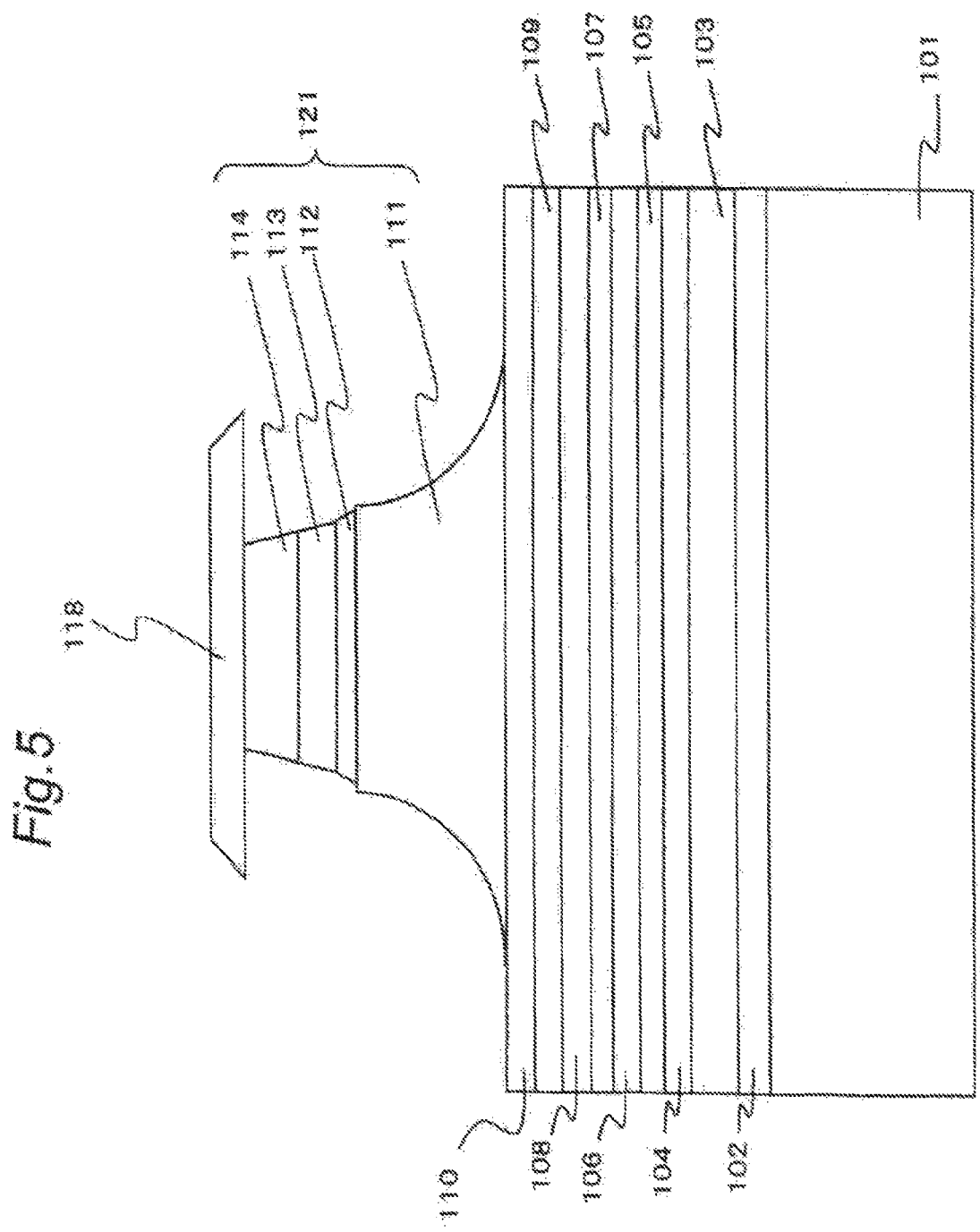

A method for forming the mesa stripe portion 121 will be described below with reference to FIGS. 3 through 5. Etching for forming the mesa stripe portion 121 is carried out by using an etchant in which sulfuric acid is mixed with a hydrogen peroxide solution (volumetric mixture ratio of sulfuric acid hydrogen peroxide solution:water=1:8:50, liquid temperature is 10° C.)

The semiconductor layers to be etched with the etchant are the p$^{++}$-GaAs second contact layer 114' and the p-GaAs first contact layer 113', which are semiconductor layers that do not contain P (phosphorus). Since the etching rate of GaAs with the etchant is about 0.01 μm/sec, the p$^{++}$-GaAs second contact layer 114' and the p-GaAs first contact layer 113' located in areas on opposite lateral sides of the resist mask 118 are etched and removed in about 50 seconds, so that a p$^{++}$-GaAs second contact layer 114" and a p-GaAs first contact layer 113' are obtained as shown in FIG. 3.

The semiconductor layer to be next etched with the etchant is the $In_{0.25}Ga_{0.75}As_{0.54}P_{0.46}$ etching rate reducing layer 112', which is a semiconductor layer that contains P. Since the etching rate of $In_{0.25}Ga_{0.75}As_{0.54}P_{0.46}$ with the etchant is about 1 nm/sec, the $In_{0.25}Ga_{0.75}As_{0.54}P_{0.46}$ etching rate reducing layer 112' located in the areas on the opposite lateral sides of the resist mask 118 is etched in about 20 seconds. At this time, the $p^{++}$-GaAs second contact layer 114 and the p-GaAs first contact layer 113 are also etched sideways, so that they are slightly reduced in size. Consequently, as shown in FIG. 4, a $p^{++}$-GaAs second contact layer 114''', a p-GaAs first contact layer 113''' and an $In_{0.25}Ga_{0.75}As_{0.54}P_{0.46}$ etching rate reducing layer 112" are obtained.

The semiconductor layer to be next etched with the etchant is the p-$Al_{0.5}Ga_{0.5}As$ second upper cladding layer 111', which is a semiconductor layer that does not contain P. Since the etching rate of AlGaAs with the etchant is about 0.01 μm/sec, the p-$Al_{0.5}Ga_{0.5}As$ second upper cladding layer 111' located downside beside the resist mask 118 is etched in about 128 seconds. At this time, the $p^{++}$-GaAs second contact layer 114''', the p-GaAs first contact layer 113''' and the $In_{0.25}Ga_{0.75}As_{0.75}P_{0.45}$ etching rate reducing layer 112" are also etched sideways, so that they are reduced in size. The $In_{0.25}Ga_{0.75}As_{0.54}P_{0.46}$ etching rate reducing layer 112" does not remain in an eaves-like shape since it is also etched from the n-GaAs substrate 101 side during the etching of the p-$Al_{0.5}Ga_{0.5}As$ second upper cladding layer 111'.

Subsequently, by further etching the p-$Al_{0.5}Ga_{0.5}As$ second upper cladding layer 111', the width of the lowermost portion of the p-$Al_{0.5}Ga_{0.5}As$ second upper cladding layer 111' is narrowed to the desired value. At this time, the p-$In_{0.34}Ga_{0.66}As_{0.3}P_{0.7}$ etching stop layer 110 located downward in the areas on the opposite lateral sides of the resist mask 118 is to be etched as a natural consequence. However, since the etching rate of $In_{0.34}Ga_{0.66}As_{0.3}P_{0.7}$ with the etchant is a very slow rate of about 0.4 nm/sec, the width control of the mesa stripe portion 121 and the flattening of the etched surface are possible. A total etching depth with the etchant becomes about 1.78 μm, and the width of the lowermost portion of the p-$Al_{0.5}Ga_{0.5}As$ second upper cladding layer 111' becomes about 3.3 μm. Consequently, as shown in FIG. 5, the $p^{++}$-GaAs second contact layer 114, the p-GaAs first contact layer 113, the $In_{0.25}Ga_{0.75}As_{0.54}P_{0.46}$ etching rate reducing layer 112 and the p-$Al_{0.5}Ga_{0.5}As$ second upper cladding layer 111 are obtained. That is, the mesa stripe portion 121 is obtained.

After the formation of the mesa stripe portion 121 in the above-described way, the resist mask 118 is removed, and the p-side electrode 115 (which is one example of the thin film) made of Ti (layer thickness: 50 nm)/Pt (layer thickness: 50 nm)/Au (layer thickness: 300 nm) is formed on the entire surface of the wafer. As a result, the p-side electrode 115 covers the upper surface and the side surfaces of the mesa stripe portion 121 and the exposed surface of the p-$In_{0.34}Ga_{0.66}As_{0.3}P_{0.7}$ etching stop layer 110.

Next, the total thickness of the wafer with the layers is made about 100 μm by etching the back surface (which is a surface that has undergone no crystal growth) of the n-GaAs substrate 101, and the n-side electrode 116 made of AuGe (layer thickness: 100 nm)/Ni (layer thickness: 15 nm)/Au (layer thickness: 300 mm) is provided to the back surface and subjected to heat treatment for one minute at 390° C.

Finally, the wafer is cleaved in planes perpendicular to the direction in which the mesa stripe portion 121 extends, so that the wafer is divided into bars each having mesa stripe portions 121 of desired cavity length. Then, a coating film (not shown) is applied to each of the two cleavage surfaces of each of the thus obtained bars, and then each bar is cut between the mesa stripe portions. As a result, the semiconductor laser device in a chip state shown in FIG. 1 is obtained.

It is noted that a metal wire (not shown) necessary for current injection is bonded onto the p-side electrode 115 located beside the mesa stripe portion 121.

Figure 7:
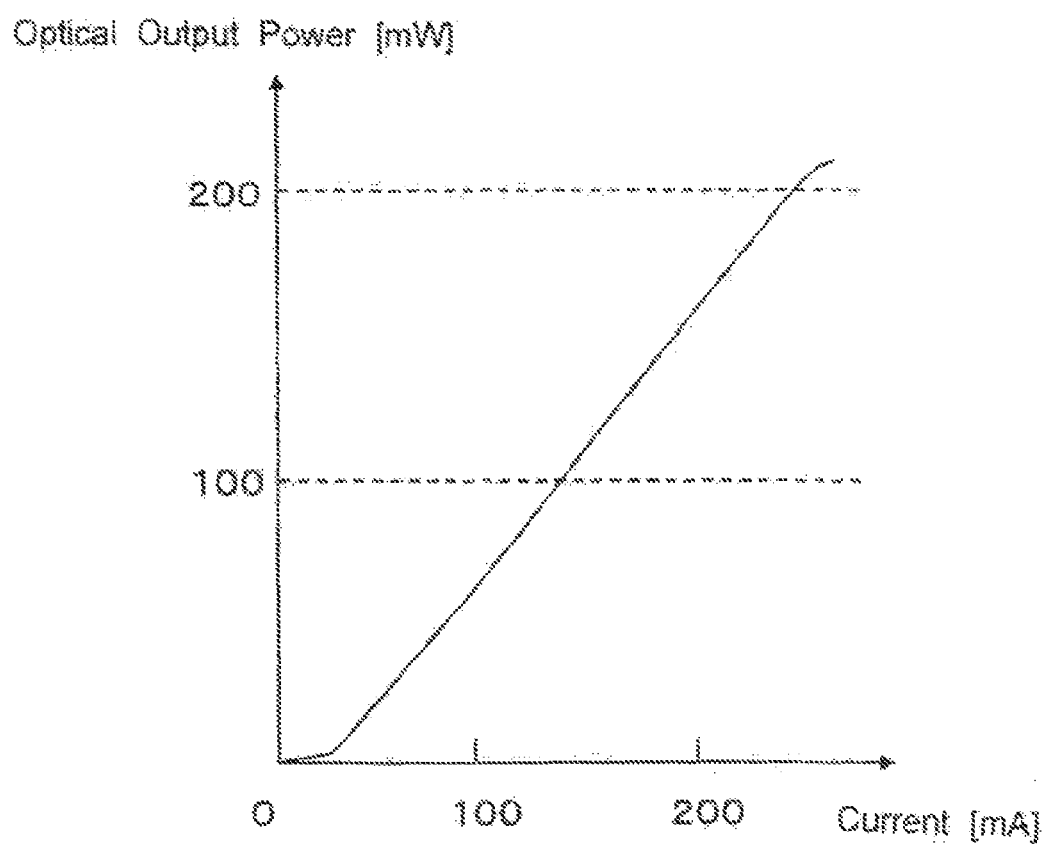
FIG. 7 is a graph showing a current-to-optical output power characteristic of the semiconductor laser device of the first embodiment.

The semiconductor laser device of the first embodiment produced in the described way had an emission wavelength of 890 nm and exhibited the characteristics of a threshold value of 20 mA and an external quantum efficiency of 0.9 with a pulse current as shown in FIG. 7. The obtained characteristics are equivalent to those of the prior art semiconductor laser device fabricated by carrying out the crystal growth process three times by the metal-organic chemical vapor deposition method.

Therefore, the semiconductor laser device of the first embodiment, which is fabricated by carrying out the crystal growth process only one time, is able to reduce the manufacturing cost than in the prior art semiconductor laser device and to exhibit the characteristics equivalent to those of the prior art semiconductor laser device.

Further, the semiconductor laser device of the first embodiment, which allows the semiconductor layers to be etched by only one etching step without changing the etchant, was able to not only reduce the number of manufacturing steps and the cost but also remarkably increase the yield.

Figure 13:
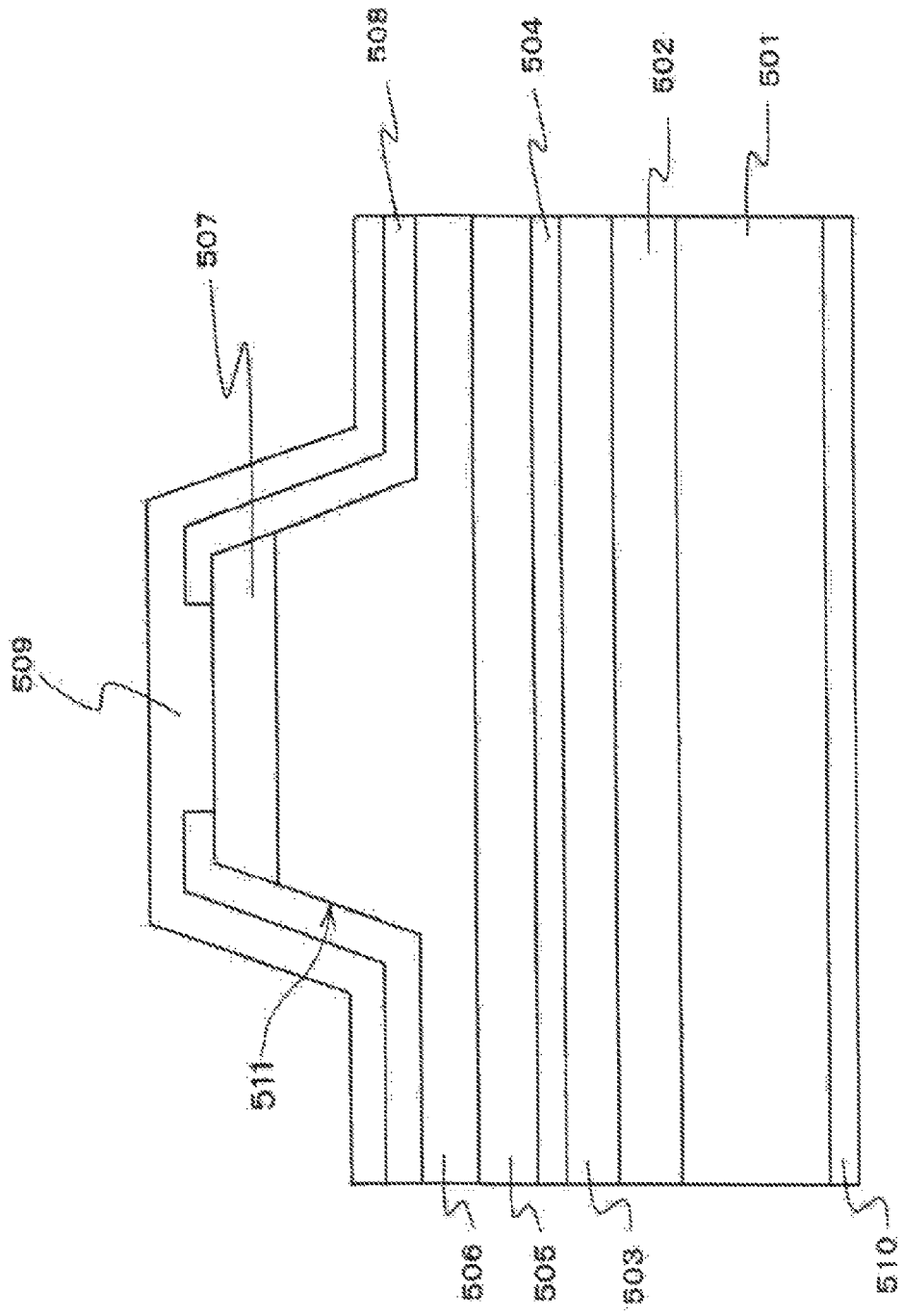
FIG. 13 is a schematic sectional view of a prior art semiconductor laser device.
Figure 14:
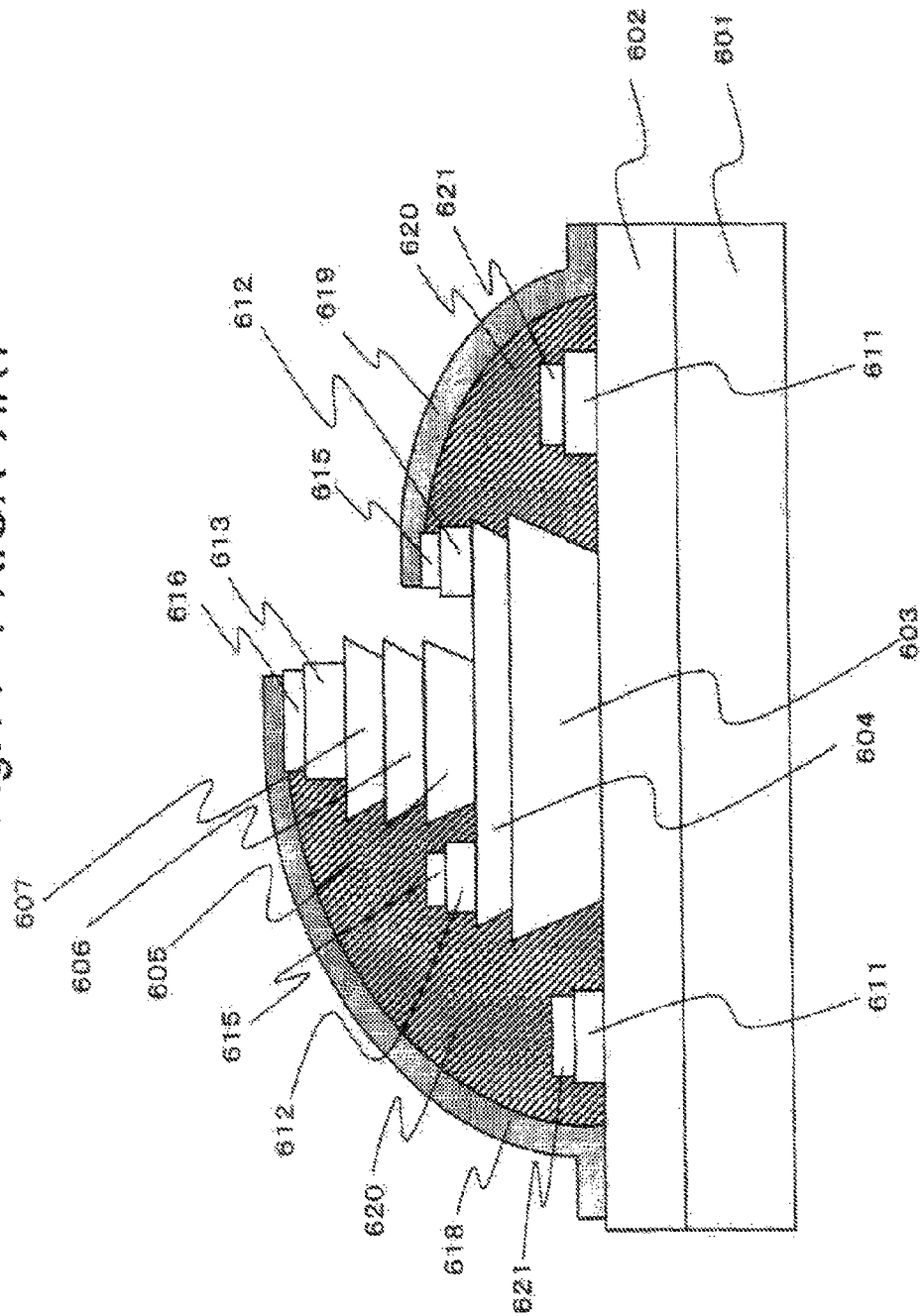
FIG. 14 is a schematic sectional view of a prior art heterojunction bipolar transistor.

Moreover, the p-side electrode 115 (total layer thickness: 400 nm) is considerably thinner than the height (about 1.8 μm) of the mesa stripe portion formed by the etching. Even with the thin film, the semiconductor laser device of the first embodiment was able to reduce the step-induced breaking or discontinuity of the electrode and thus increase the yield in comparison with the prior art semiconductor laser device of the air ridge structure of FIG. 13.

Figure 6:
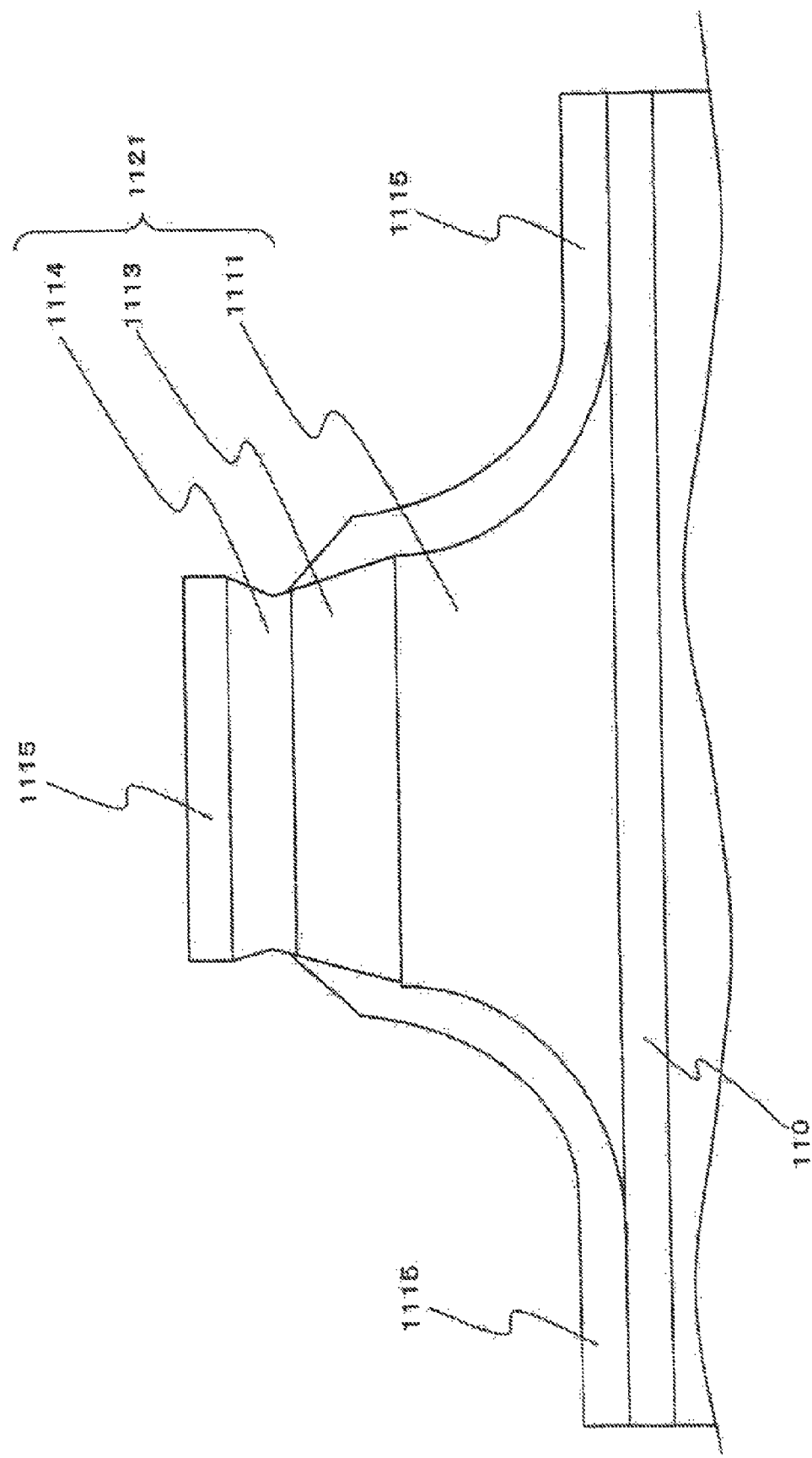
FIG. 6 is a schematic sectional view of an essential part of a semiconductor laser device of a comparative example.

FIG. 6 shows a schematic sectional view of an essential part of a semiconductor laser device as a comparative example in contrast to the semiconductor laser device of the first embodiment. In FIG. 6, only the portion from the etching stop layer 110 up is shown.

The semiconductor laser device of the comparative example differs from the semiconductor laser device of the first embodiment in that a mesa stripe portion 1121 of the comparative example is constructed of a p-$Al_{0.5}Ga_{0.5}As$ second upper cladding layer 1111, a p-GaAs first contact layer 1113 and a $p^{++}$-GaAs second contact layer 1114.

That is, in manufacturing the semiconductor laser device of the comparative example, the manufacturing method of the semiconductor laser device of the first embodiment is modified such that the mesa stripe portion 1121 including no etching rate reducing layer is produced.

Since in the semiconductor laser device of the comparative example the side surface located in the neighborhood of the upper surface portion of the $p^{++}$-GaAs second contact layer 1114 becomes disadvantageously steep, when a p-side electrode 1115 is formed, the p-side electrode 1115 would suffer from the step-induced breaking or discontinuity on the steep side surface.

The reason why there occurs the step-induced breaking of the p-side electrode 1115 is considered to be that the progress of the etching in the semiconductor layer right under the resist mask used for forming the mesa stripe portion 1121 differs from the progress of the etching in the other semiconductor layers.

The step-induced breaking as described above can be avoided by carrying out side etching of the first and second contact layers for a longer time by provision of the etching rate reducing layer as in the first embodiment.

Moreover, the problem of the step-induced breaking can be avoided if only the first and second contact layers made of GaAs are further etched without changing the shape of the second upper cladding layer made of AlGaAs. However, to do so, the contact layers must be etched again with an etchant (e.g., an aqueous solution of a mixture of ammonia and a hydrogen peroxide solution) that has selectivity such that AlGaAs is not etched but GaAs is etched. This would cause an increase in the number of manufacturing process steps and the manufacturing cost and further might cause a reduction in the yield due to the etching performed two times with different etchants.

In the first embodiment, the etching process is performed only one time with the same etchant and during the etching process the etching rate becomes slow when the etching rate reducing layer is exposed as a consequence of the etching or removal of the first and second contact layers. Therefore, only the etching in the horizontal direction progresses in the first and second contact layers while the etching rate reducing layer is being etched. Since the etching rate becomes fast again when the etching rate reducing layer is etched and the second upper cladding layer is exposed, the second upper cladding layer is etched almost similarly to the etching effected on the first and second contact layers. Consequently, the first and second contact layers, the etching rate reducing layer and the second upper cladding layer left by the etching mask are increased in width in the horizontal direction towards the GaAs substrate. Therefore, the electrode can be formed continuously without step-induced breaking from the top portion of the second contact layer to the surface of the etching stop layer. Therefore, the yield of the semiconductor laser device of the first embodiment can be improved, and this allows the manufacturing cost of the semiconductor laser device of the first embodiment to be reduced.

Figure 9A:
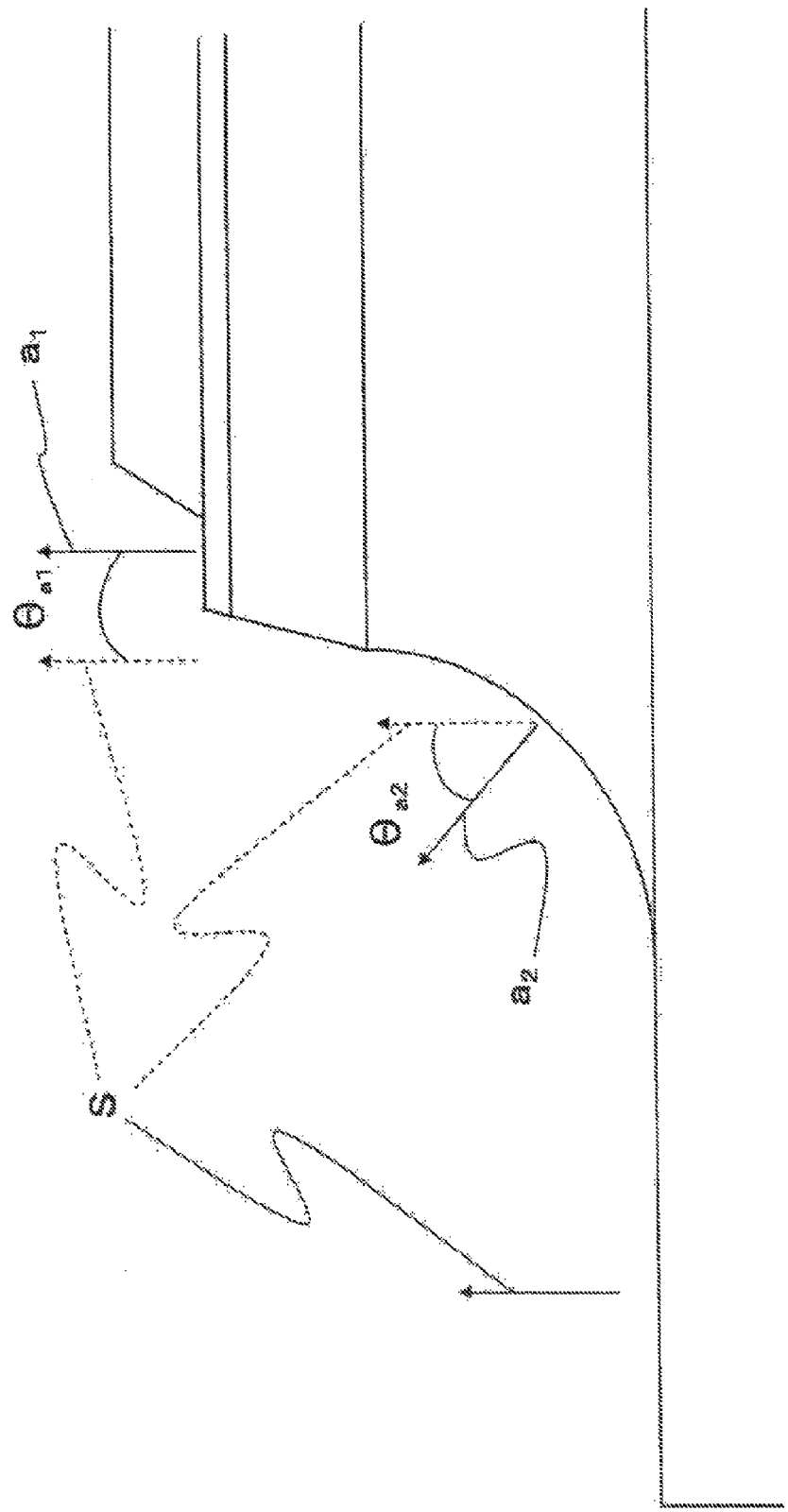
FIG. 9A is a schematic view showing normal vectors on a surface exposed by etching.
Figure 9C:
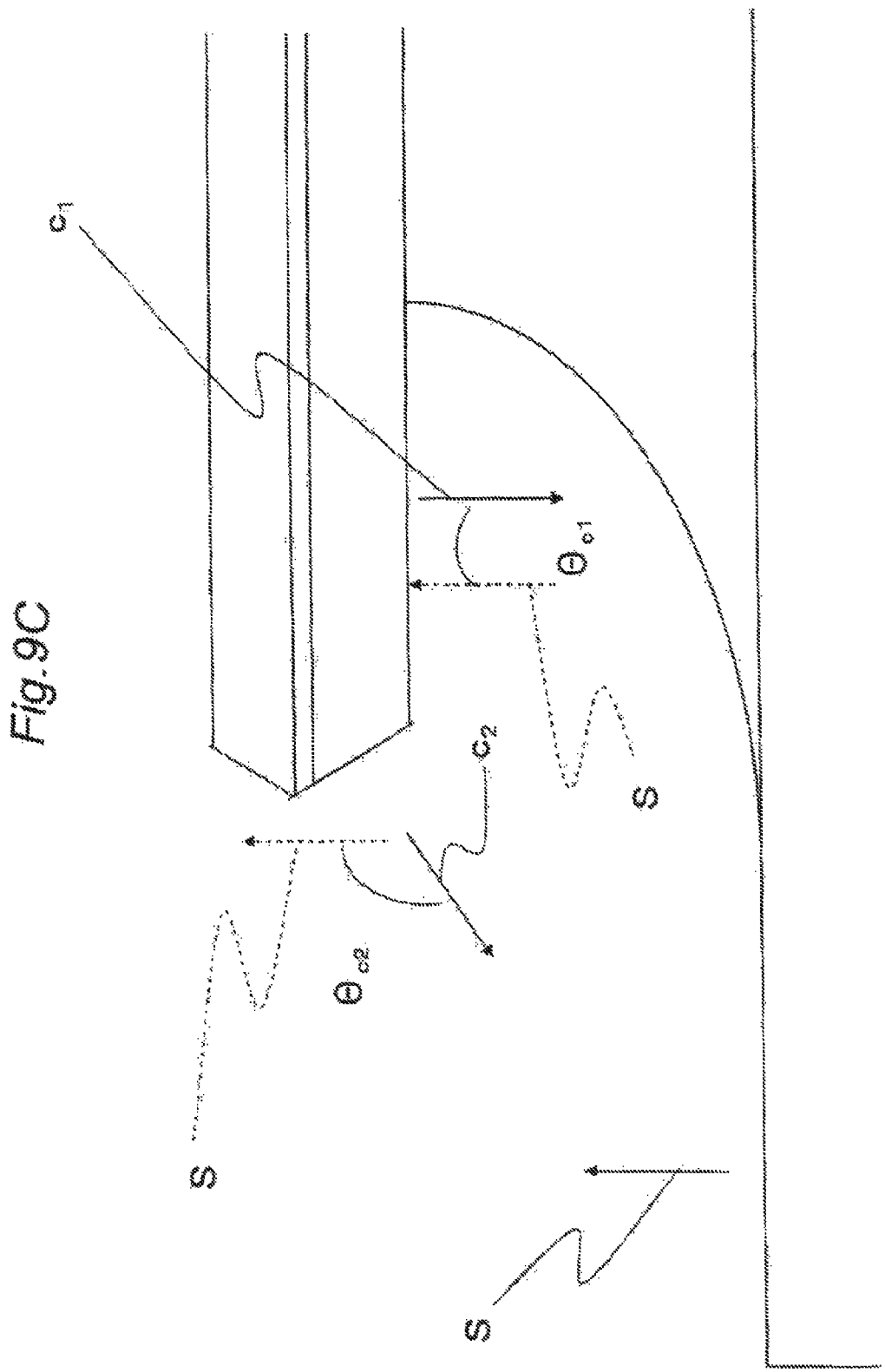
FIG. 9C is a schematic view showing normal vectors on a surface exposed by etching.

FIGS. 9A through 9C show schematic sectional views of a part of structures resulting from the etching. As shown in FIG. 9A, normal vectors $a_1$ and $a_2$ on the surface exposed by the etching have upward components S. In such a region, step-induced breaking can be prevented even if a thin film is placed on the upper surface.

Moreover, even in the case of the cross section as shown in FIG. 9B as another example, i.e., in the case where the surface exposed by the etching is a convex surface or a concave surface, an effect similar to the above case can be obtained since normal vectors $b_1$, $b_2$ and $b_3$ on the surface exposed by the etching also have upward components S.

However, in the case of a cross section as shown in FIG. 9C, i.e., when a region where a "shade" exists when viewed from above the substrate surface, the effect cannot be obtained since normal vectors $c_1$ and $c_2$ on the surface exposed by the etching do not have upward components S.

However, as in the first embodiment, so long as there is a normal vector having an upward component on the side surface of the mesa stripe portion 121 in at least one path that connects one point at the p-side electrode 115 located on the side opposite from the substrate 101 with respect to the etching rate reducing layer 112 with one point at the p-side electrode 115 located on the same side as the substrate 101 with respect to the etching rate reducing layer 112, the p-side electrode 115 can be continuously placed without undergoing the step-induced breaking in the path even if a region as shown in FIG. 9C exists in another path, and electric conduction using the path can reliably be achieved.

Moreover, in the first embodiment, since the etching step is carried out only one time in forming the semiconductor laser device, the number of manufacturing process steps and the manufacturing cost can largely be reduced. This is because a ridge shape that enables electrode formation without its breaking or discontinuity can be achieved by utilizing the etching rate reducing layer even through one-time etching step using an etchant of one kind.

Moreover, since the etching rate reducing layer is made of InGaAsP, the second upper cladding layer is made of AlGaAs, and the first and second contact layers are made of GaAs in the first embodiment, etching capable of suitably utilizing the effect of employing the etching rate reducing layer can be carried out.

Moreover, since the mixture aqueous solution of sulfuric acid and hydrogen peroxide solution is used as the etchant in the first embodiment, the etching rate of the etching rate reducing layer is controllable so as to be slower than the etching rate of the second upper cladding layer and the first and second contact layers.

Moreover, the bandgap energy of the first contact layer is 1.42 eV, and the bandgap energy of the second upper cladding layer is 2.05 eV in the first embodiment. And, the bandgap energy of the etching rate reducing layer located between the first contact layer and the second upper cladding layer is 1.59 eV. Since the bandgap energy of the etching rate reducing layer is greater than the bandgap energy of the first contact layer and smaller than the bandgap energy of the second upper cladding layer, band discontinuity between the first contact layer and the second upper cladding layer is eased. Therefore, a current easily flows to the mesa stripe portion that includes the first contact layer, the second upper cladding layer and the etching rate reducing layer, which contributes to the reduction of the resistance of the semiconductor laser device.

Further, since the carriers directed from the second contact layer to the active layer are holes and both of the following Equations (1) and (2) are satisfied in the first embodiment, the band discontinuity to the holes is eased.

$$Ev3-Ev2>0 \qquad (1)$$

$$Ev2-Ev1>0 \qquad (2)$$

where,

Ev1: Energy of the valence band of the second upper cladding layer;

Ev2: Energy of the valence band of the etching rate reducing layer; and

Ev3: Energy of the valence band of the second contact layer.

Concretely, in the first embodiment, Ev3−Ev2=0.16 eV, and Ev2−Ev1=0.11 eV.

Moreover, when the first conductive type and the second conductive type are assumed to be the p-type and the n-type, respectively, in which case electrons are carriers, conversely to the case of the first embodiment, similar discussion and consideration can be applicable just by replacing the energy of the valence band with the energy of the conduction band and reversing the inequality sign in Equations (1) and (2), and it will be understood that the band discontinuity against the electrons can be eased.

Moreover, in the first embodiment, the etching rate reducing layer is made of InGaAsP, of which the P mole fraction is 0.46. Also, the second upper cladding layer and the first and second contact layers are made of AlGaAs and GaAs. That is, the etching rate reducing layer has a greater P mole fraction. Therefore, when these semiconductor layers are etched with an etchant of one kind, the etching rate of the etching rate reducing layer can easily be made slower than the etching rates of the second upper cladding layer and the first and second contact layers.

Moreover, by employing at least the etching rate reducing layer that contains P, the second upper cladding layer made of AlGaAs and the first and second contact layers made of GaAs as in the first embodiment, semiconductor laser devices made of a Group III-V compound can be obtained with high yield.

Moreover, since the P mole fraction in Group V elements in the etching rate reducing layer is 0.46, which is smaller than 0.6, in the first embodiment, the etching rate reducing layer can be prevented from becoming unetchable.

In the etching process in the first embodiment, reaction progresses in two steps: formation of an oxide layer on the etched surface and removal of the oxide layer. It can be considered that, when the P mole fraction in the Group V elements in the etching rate reducing layer made of InGaAsP becomes equal to or greater than 0.6, the reaction is decelerated because of difficulties in the formation of the oxide layer on the etching surface or a reduction in the removal rate of the oxide layer or both of them, as a result of which the etching of the etching rate reducing layer becomes too slow.

FIG. 8 shows a relation between the etching rate of the etching rate reducing layer made of InGaAsP and the P mole fraction in the Group V elements in the etching rate reducing layer. The etching rates plotted were the ones at which the etching rate reducing layers were etched with an etchant in which sulfuric acid is mixed with a hydrogen peroxide solution (of which the volumetric mixture ratio is sulfuric acid: hydrogen peroxide solution:water 1:8:50, and the liquid temperature is 10° C.).

As is apparent from FIG. 8, the etching rate is slower when the P mole fraction in the Group V elements in the etching rate reducing layer is not smaller than 0.6 than when the P mole fraction in the Group V elements in the etching rate reducing layer is smaller than 0.6.

Therefore, the P mole fraction in the Group V elements in the etching rate reducing layer should preferably be smaller than 0.6. Among others, if the P mole fraction in the Group V elements in the etching rate reducing layer is set smaller than 0.5 and the etching rate reducing layer is As-rich as in the first embodiment, the effect of appropriately reducing the etching rate by the etching rate reducing layer can be obtained, and this is more preferable.

On the other hand, as can also be understood from FIG. 8, if the P mole fraction in the Group V elements in the etching rate reducing layer is set to be 0.2 or smaller, the etching rate of the etching rate reducing layer disadvantageously becomes one-fifth or greater of the etching rate of the first and second contact layers made of GaAs and the second upper cladding layer made of AlGaAs. In this case, the effect of appropriately reducing the etching rate is hardly obtained in the etching rate reducing layer. As a result, the mesa stripe portion of the desired shape will not be obtained. From this, the P mole fraction in the Group V elements in the etching rate reducing layer should preferably be greater than 0.2.

Moreover, it is apparent also from FIG. 8 that the etching rate becomes extremely small and the etching does not progress when the P mole fraction in the Group V elements is not smaller than 0.6. By taking advantage of the characteristic and constituting the ridge lower layer of the first upper cladding layer lower layer and the etching stop layer of different compositions and setting the P mole fraction in the Group V elements in the etching stop layer, which is the uppermost layer of the ridge lower layer, to 0.6 or more as in the first embodiment, the semiconductor layer under the etching stop layer can reliably be prevented from being etched, and the mesa stripe portion can be formed to a well controlled width.

Moreover, since the layer thickness of the etching stop layer is 15 nm in the first embodiment, the semiconductor layer under the etching stop layer can reliably be prevented from being etched.

Although the second contact layer made of GaAs is employed in the first embodiment, it is acceptable to employ a second contact layer made of any one of InGaAs, AlAs, InAs, AlInAs and AlGaInAs.

The P mole fraction in the Group V elements in the etching stop layer is 0.7 in the first embodiment, but it may be 0.6 or more.

The layer thickness of the etching stop layer, which is 15 nm in the first embodiment, may be 10 nm or more.

Although the etching stop layer made of InGaAsP is employed in the first embodiment, it is acceptable to employ an etching stop layer made of any one of InGaP, GaAsP, AlGaInP, AlGaInAsP and AlGaAsP. The etching stop layer should also preferably have a P mole fraction in the Group V elements of 0.6 or more and a layer thickness of 10 nm or more.

Although the etching rate reducing layer made of InGaAsP is employed in the first embodiment, it is acceptable to use an etching rate reducing layer made of any one of GaAsP, AlGaAsP, AlGaInAsP, InAsP, InAlAsP and AlAsP. Such an etching rate reducing layer should also preferably have a P mole fraction in Group V elements of smaller than 0.6.

The p-electrode exemplifying the thin film in the first embodiment has a total layer thickness of 400 nm, whereas a difference in level between the top of the mesa stripe portion and the etching stop layer is about 1.80 μm. That is, the total layer thickness of the p-electrode is much smaller than the difference in level between the top of the mesa stripe portion and the etching stop layer. The layer thickness of the thin film should preferably be not greater than about one-third the difference in level. The smaller the thickness of the thin film, the further the consumption of the raw material to be used for the thin film formation can be suppressed, allowing the cost reduction of the device to be achieved.

Although the current constriction is effected by using the Schottky junction of the etching stop layer and the p-side electrode in the first embodiment, it is also acceptable to effect the current constriction by using an air ridge structure using an insulator, e.g., silicon oxide ($SiO_2$), silicon nitride ($SiN_x$), etc. That is, it is acceptable to cover the side surface of the mesa stripe portion and the surface of the etching stop layer with the insulator and put the p-side electrode in contact with the upper surface of the second contact layer exposed from the insulator. In a word, the structure constructed of the insulating overcoat 508 and the p-side electrode 509 of FIG. 13 may be employed. Even if the structure constructed of the insulating overcoat 508 and the p-side electrode 509 is employed in the semiconductor laser device of the first embodiment, it is possible to sufficiently obtain the effect of improving the yield by preventing the step-induced breaking of the thin film, which is the insulator and the electrode.

Moreover, in the case where the current constriction is effected by using the Schottky junction as described above, if the lowermost layer of the p-side electrode is made a compound layer by carrying out heat treatment after the formation of the p-side electrode, the Schottky junction in the current constriction region and the ohmic junction of the contact layer with the p-side electrode are enhanced so that a current can be injected into only the mesa stripe portion with a low resistance.

Since the Schottky junction property and the ohmic junction property are further reinforced as described above, low threshold current oscillation, high power operation and long-term reliability are obtained carrying out neither the current constriction layer embedding regrowth step nor the contact layer crystal regrowth step.

Moreover, since neither the current constriction layer embedding regrowth step nor the contact layer crystal regrowth step is carried out, the manufacturing process is simplified. Therefore, the manufacturing cost can be reduced.

Moreover, since the p-side electrode is formed on the mesa stripe portion and the etching stop layer in the first embodiment, heat radiation or dissipation characteristics can be improved. Therefore, the reliability of the semiconductor laser device of the first embodiment can be improved.

The electrode materials are deposited directly on the side surfaces of the mesa stripe portion in the first embodiment. In order to reliably form the electrode free from step-induced breaking at the side surfaces of the mesa stripe portion which are sloped with respect to the substrate, it is preferable to use a material of good adhesion for the lowermost layer of the electrode or to increase the thickness of the electrode. However, thickening the electrode increases the consumption of the materials of the electrode and causes a cost increase. Accordingly, it is preferable to use Ti or Pt for the material of the lowermost layer of the electrode as in the present embodiment. Since these materials have sufficient adhesion, the electrode can be formed as a sufficiently thin film, which reduces the consumption of the materials of the electrode. As a result, a low-cost semiconductor laser device is obtained.

Moreover, since the temperature of heat treatment carried out on the p-side electrode is 390° C. and the lowermost layer of the p-side electrode is made of Ti in the first embodiment, an alloying reaction between Ti and the semiconductor layer can be aroused.

If the heat treatment is carried out at about 400° C. after Ti is vapor deposited onto a semiconductor layer as in the first embodiment, the oxide layer formed on the surface of the semiconductor layer during the manufacturing process is removed, and a stable Schottky junction can be obtained for a lightly-doped semiconductor layer of a doping concentration of not higher than $1 \times 10^{17}$ cm$^{-3}$. When the lightly-doped semiconductor layer is an InGaAsP layer or an AlGaAs layer, a Schottky junction that is particularly thermally and electrically stable can be obtained. This is presumably ascribed to the fact that the lowermost layer of the electrode becomes a very thin Ti alloy layer as a result of the heat treatment. Therefore, the effect of obtaining such a stable Schottky junction cannot easily be produced unless the heat treatment is carried out.

On the other hand, in the case where Ti is brought in contact with a heavily-doped semiconductor layer (such as the GaAs layer and InGaAs layer) of a doping concentration of not lower than $1 \times 10^{10}$ cm$^{-3}$ and then appropriate heat treatment is carried out, oxide formed on the surface of the semiconductor layer during the manufacturing process can be removed and a TiAs layer is formed, whereby a low contact resistance is achieved. In this case, the temperature of the heat treatment is not lower than 350° C. and not higher than 430° C. When the temperature of heat treatment is lower than 350° C., the alloying reaction for generation of the heavily-doped side compound layer does not sufficiently progress. Moreover, when the temperature of heat treatment exceeds 430° C., the contact resistance gradually deteriorates at the ohmic junction. This is presumably ascribed to the generation of a $Ti_xGa_{1-x}$ layer and the mixing of the metal material in the layers located above Ti.

Although the temperature of the heat treatment carried out on the p-side electrode is 390° C. in the first embodiment, the temperature may be any temperature in the range of not lower than 350° C. and not higher than 430° C. If the temperature of the heat treatment is lower than 350° C., the heavily-doped semiconductor layer of a doping concentration of $1 \times 10^{18}$ cm$^{-3}$ or higher would not provide a sufficient compound layer, and the lightly-doped semiconductor layer of a doping concentration of $1 \times 10^{17}$ cm$^{-3}$ or lower would not provide a sufficient compound layer, either. Moreover, if the temperature of the heat treatment exceeds 430° C., the contact resistance deteriorates as described above, so that the characteristics of the semiconductor laser device also deteriorate.

The lowermost layer of the p-side electrode is made of Ti in the first embodiment. Alternatively, the lowermost layer of the p-side electrode may be made of Pt. When the lowermost layer of the p-side electrode is made of Pt as well, the temperature of heat treatment to be carried out on the p-side electrode is set to not lower than 350° C. and not higher than 430° C. If the temperature of the heat treatment is lower than 350° C., the heavily-doped semiconductor layer of a doping concentration of $1 \times 10^{16}$ cm$^{-3}$ or higher would not provide a sufficient heavily-doped side compound layer, and the lightly-doped semiconductor layer of a doping concentration of $1 \times 10^{17}$ cm$^{-3}$ or lower would not provide a sufficient lightly-doped side compound layer, either. Moreover, if the temperature of the heat treatment exceeds 450° C., Pt is excessively diffused in the semiconductor layer, so that the characteristics of the semiconductor laser device also deteriorate.

In the first embodiment, the first upper cladding layer lower layer of a doping concentration of $1.35 \times 10^{18}$ cm$^{-3}$, the first upper cladding layer upper layer of a doping concentration of $1.0 \times 10^{17}$ cm$^{-3}$ and the etching stop layer of a doping concentration of $1.0 \times 10^{17}$ cm$^{-3}$ are formed between the mesa stripe portion and the active layer. With this arrangement, the degree of freedom of the optical design is increased and an increase in the device resistance can be suppressed since the layer thickness, the composition and so on of the p-type semiconductor layers can freely be changed according to the specifications of the optical characteristics demanded by the p-type semiconductor layers without suffering restrictions to be imposed in consideration of the Schottky junction characteristics. Consequently, further reduction in the consumption of power can be achieved.

Moreover, since the etchant used in the first embodiment has a volumetric mixture ratio of sulfuric acid, hydrogen peroxide solution, and water that is 1:8:50, suitable etching is achieved. If the volume ratio of the sulfuric acid is larger, the etching rate increases and the etching control becomes difficult. Also, if the volume ratio of the hydrogen peroxide solution is larger, nonselectivity to the etching of GaAs and AlGaAs decreases.

In the first embodiment, the mesa stripe portion 121 has normal vectors having upward components on both sides of the mesa. The effects resulting from this arrangement can be similarly obtained even in a structure that has a step only on one side surface or in a groove structure if the side surface of the former structure or side surfaces of the groove have normal vectors having upward components.

Although the semiconductor laser device has a wavelength of 890 nm in the first embodiment, the wavelength may be any in a wavelength band of, for example, 650-nm band, 1.3-μm band, 1.55-μm band or the like.

The manufacturing method of the first embodiment may be used for other semiconductor devices such as transistors or the like.

Second Embodiment

Figure 10:
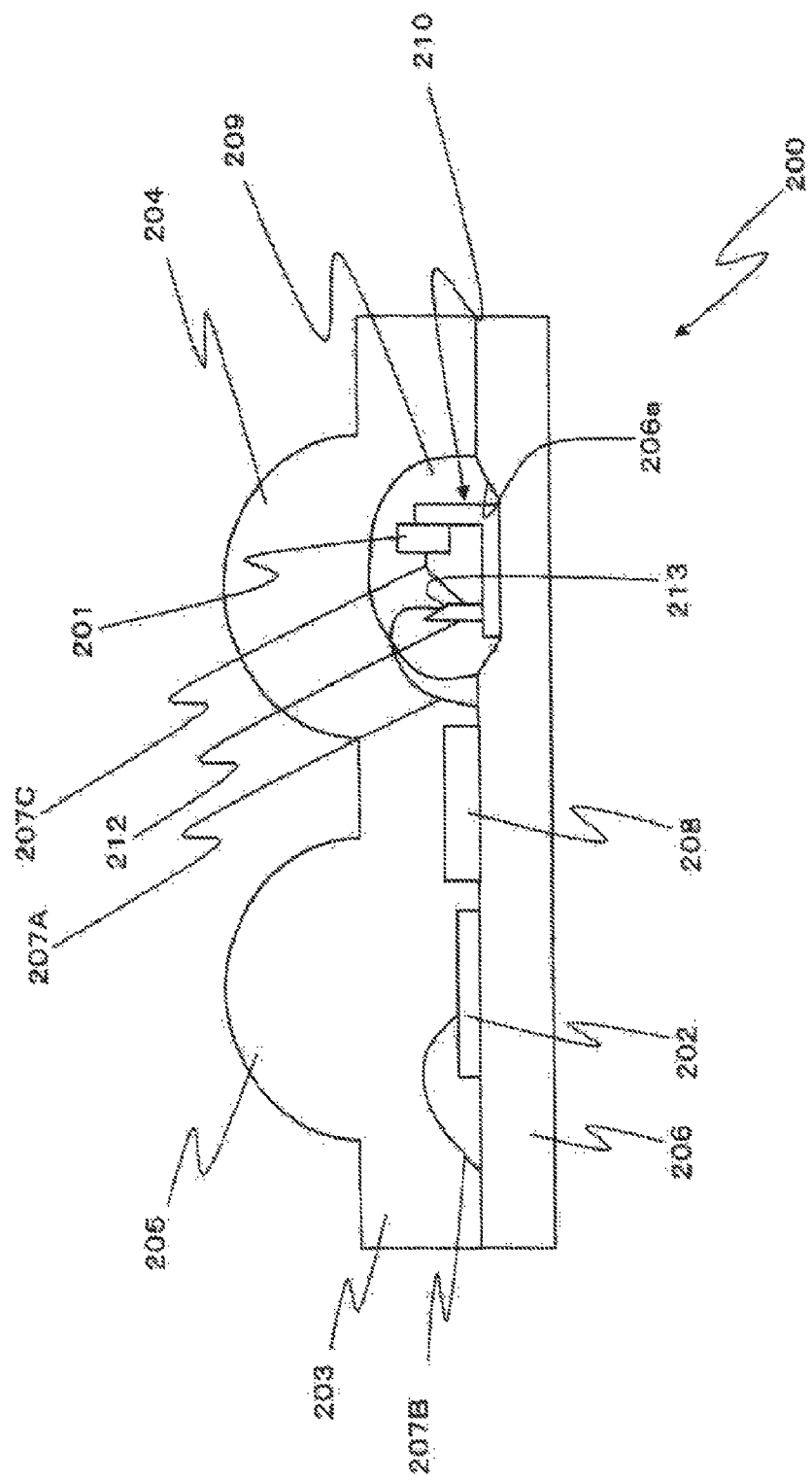
FIG. 10 is a schematic sectional view of an optical transmission module of an optical transmission system according to a second embodiment of the present invention.
Figure 11:
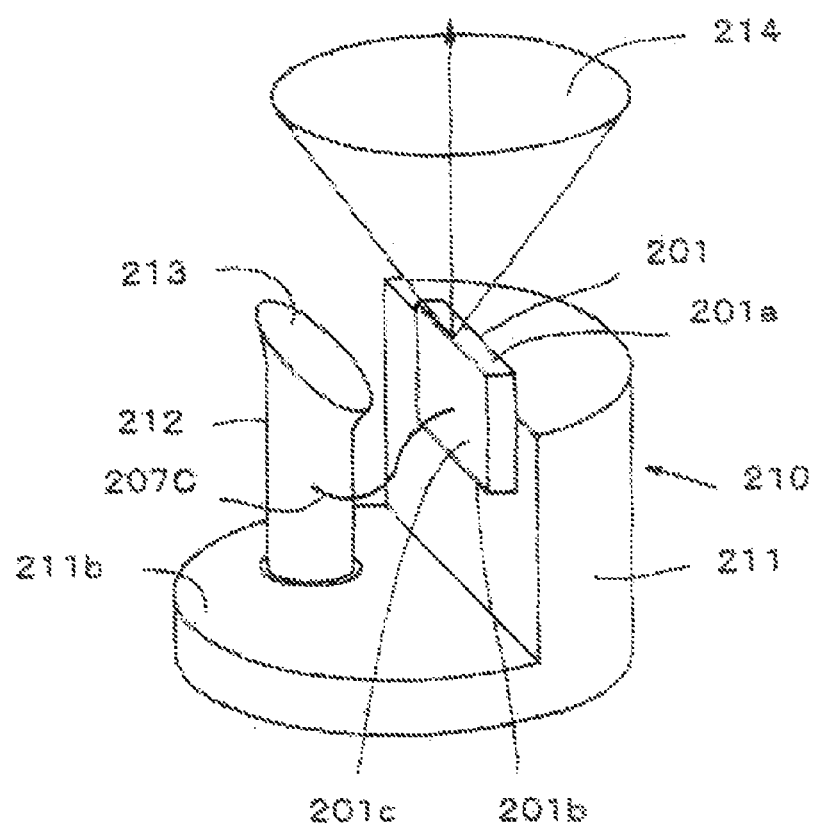
FIG. 11 is a schematic perspective view of a light source of the optical transmission system of the second embodiment.

FIG. 10 shows a schematic sectional view of an optical transmission module 200 of the optical transmission system according to the second embodiment of the present invention. FIG. 11 shows a schematic perspective view of a light source section of the module. The same optical transmission modules 200 provided on both sides of communications to be exchanged (e.g., a terminal and a server) constitute the optical transmission system that transmits and receives optical signals between these optical transmission modules 200, which will be described in detail later.

As shown in FIG. 10, the optical transmission module 200 includes the InGaAs semiconductor laser device (laser chip) 201 having an emission wavelength of 890 nm as described in connection with the first embodiment as a light source, and a photodetector 202 that is a pin photodiode of Si (silicon).

The laser chip 201 is mounted on a circuit board 206. The circuit board 206 has, on its top surface, patterns of both positive and negative electrodes for driving the semiconductor laser, and a recess 206a in which the laser chip 201 is received. The recess 206a has a depth of 300 μm. A laser mount (i.e., a mount member) 210 to which the laser chip 201 is attached is fixed with solder to the bottom surface of the recess 206a. The depth of the recess 206a is designed such that the emission of laser light from the laser chip 201 is not disturbed. Moreover, the surface of the recess 206a has a roughness adjusted so that no bad influence is exerted on the angle of radiation of the laser light.

The photodetector 202 is mounted on the circuit board 206, and an electrical signal is taken out via a wire 207B.

Moreover, an IC (Integrated Circuit) 208 for laser driving and reception signal processing is mounted on the circuit board 206.

An appropriate amount of liquid silicon resin 209 mixed with filler for diffusing light is dropped in the recess 206a. With this arrangement, the silicon resin 209 stays in the recess 206a due to its surface tension and fixes the laser mount 210 to the recess 206a by covering the mount. Although the recess 206a is formed on the surface of the circuit board 206, and the laser mount 210 is fixed to the bottom surface of the recess 206a in the second embodiment, the recess 206a is not always required to be formed since the silicon resin 209 stays on the laser chip surface and its peripheries due to the surface tension as described above.

The silicon resin 209 is cured until it is put into a jelly-like state by heating for about five minutes at 80° C. Moreover, the silicon resin 209 is covered with a transparent epoxy resin mold 203. In the epoxy resin mold 203, a lens portion 204 for controlling the angle of radiation of laser light and a lens portion 205 for condensing the signal light are integrally formed as molded lenses. The lens portion 204 is located above the laser chip 201, while the lens portion 205 is located above the photodetector 202.

As described above, the optical transmission system has a premise that the optical transmission module performs the transmission and reception of optical signals with a same optical transmission module on the other party's side, as described above. Therefore, an optical signal emitted with information from the laser chip 201 is received by the photodetector of the optical transmission module on the other party's side. Moreover, the optical signal emitted with information from the laser chip of the optical transmission module on the other party's side is received by the photodetector 202 on this side.

The laser mount 210 will be described below with reference to FIG. 11.

The laser mount 210 has a cross-sectionally L-shaped heat sink 211. The laser chip 201 is die-bonded to the heat sink 211 with an In paste. The lower surface 201b of the laser chip 201 is coated with a high reflection coating, while the upper surface 201a of the laser chip is coated with a low reflection coating. These reflection coatings are provided to double as protective coats to protect the laser chip end surfaces.

A positive electrode 212 is fixed to a base portion 211b of the heat sink 211. An insulator is interposed between the positive electrode 212 and the base 211b, so that the positive electrode 212 is prevented from having electrical continuity to the heat sink 211. Moreover, the positive electrode 212 is connected via a gold wire 207C to an electrode region 201c provided on the Schottky junction at the surface of the laser chip 201.

The laser mount 210 is fixed with solder to a negative electrode portion (not shown) for driving the laser on the circuit board 206. Moreover, a flat portion 213 of the positive electrode 212 is electrically connected to a positive electrode portion (not shown) for driving the laser on the circuit board 206 via a wire 207A. With the wiring formation, the optical transmission module 200 capable of obtaining a laser beam 214 by oscillation is completed.

The optical transmission module 200, which employs the one-time growth type laser chip 201 according to the first embodiment that can be manufactured at low cost, is therefore able to largely suppress low the module unit price in comparison with the conventional case that requires more than one crystal growth step.

Third Embodiment

Figure 12:
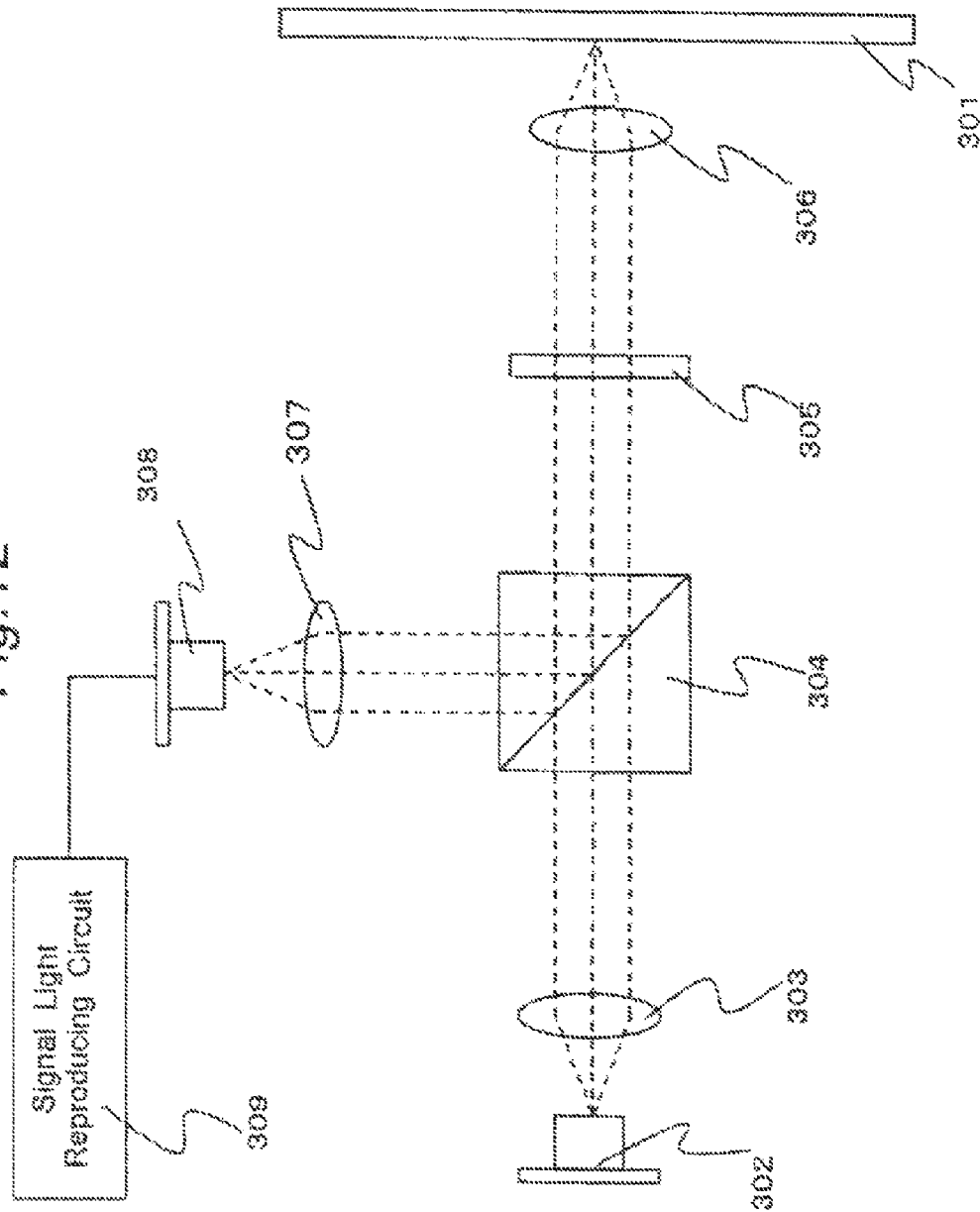
FIG. 12 is a schematic structural view of an optical disk unit according to a third embodiment of the present invention.

FIG. 12 shows one example of the structure of an optical disk unit according to the present invention.

The optical disk unit has a light-emitting device for writing data into an optical disk 301 and reproducing the data written in the optical disk 301. The light-emitting device is a semiconductor laser device 302, which is obtained by modifying the semiconductor laser device of the first embodiment to make changes to the layers of the quantum well active layer and so on such that the semiconductor laser device 302 oscillates at a wavelength of 780 nm. Fabricating process steps such as a step for forming a regular mesa shaped ridge stripe portion of the semiconductor laser device 302 are similar to those of the first embodiment.

The optical disk unit will be described more in detail below.

A signal light (laser light) is emitted from the semiconductor laser device 302 toward the optical disk 301 when data is written into the optical disk 301 in the optical disk unit. The signal light passes through a collimator lens 303, becoming parallel light, and is transmitted through a beam splitter 304. After having its polarized state adjusted by a λ/4 polarizer 305, the light is condensed on the surface of the optical disk 301 by an irradiation object lens 306.

In the optical disk unit, when the data recorded in the optical disk 301 is read, a laser beam with no data signal superimposed thereon travels along the same path as in the write operation, irradiating the optical disk 301. Then, the laser beam reflected on the surface of the optical disk 301 passes through the laser-beam irradiation objective lens 306 and the λ/4 polarizer 305, and is thereafter reflected by the beam splitter 304 so as for its traveling direction to be changed by 90°. Subsequently, the laser beam is focused by a reproduction-light objective lens 307 and applied to a signal-detection use photodetector 308. Then, in the signal-detection use photodetector 308, a data signal represented by the incident laser beam is transformed into an electric signal, which is then supplied to a signal light reproducing circuit 309. The signal light reproducing circuit 309 regenerates an original signal from the electrical signal.

Since the optical disk unit performing the above operations has, as a light-emitting device, the semiconductor laser device 302 that requires a reduced number of manufacturing process steps and a reduced manufacturing cost, as compared with the prior art semiconductor laser device. Thus, the manufacturing cost of the optical disk unit is reduced.

This embodiment has been described on a case where the semiconductor laser device of the present invention is applied to a recording and playback type optical disk unit. However, the semiconductor laser device of this invention is applicable also to optical-disk recording units or optical-disk playback units using the same 780 nm wavelength band, as well as to optical disk units of another wavelength band (e.g., 650-nm band).

It is a matter of course that the semiconductor device of the present invention is not limited to only the illustrated examples described above but modifiable in a variety of ways with regard to, for example, the layer thickness and the number of layers of the well layer and the barrier layer of the semiconductor laser device unless they depart from the scope of the present invention.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor device manufacturing method comprising:
    a first semiconductor layer forming step forming on a semiconductor substrate a first semiconductor layer that has an etching rate;
    a second semiconductor layer forming step forming on the first semiconductor layer a second semiconductor layer that has an etching rate slower than the etching rate of the first semiconductor layer;
    a third semiconductor layer forming step forming on the second semiconductor layer a third semiconductor layer that has an etching rate faster than the etching rate of the second semiconductor layer;
    an etching mask forming step forming an etching mask on the third semiconductor layer;
    an etching step etching, by using the etching mask and an etchant, the third semiconductor layer, the second semiconductor layer and the first semiconductor layer in a region outside the etching mask; and
    a thin film forming step forming a thin film such that the thin film continuously coats an upper surface and side surfaces of a semiconductor layer group that includes the third semiconductor layer, the second semiconductor layer and the first semiconductor layer remaining after the etching step.

2. The semiconductor device manufacturing method as claimed in claim 1, wherein
    the first semiconductor layer and the third semiconductor layer each comprise any one of AlGaAs, GaAs and InGaAs,
    the second semiconductor layer comprises InGaAsP or GaAsP,
    a P mole fraction in Group V elements in the second semiconductor layer is larger than 0.2 but smaller than 0.6, and
    the etchant is a mixture aqueous solution of sulfuric acid and a hydrogen peroxide solution.

3. The semiconductor device manufacturing method as claimed in claim 1, further comprising:
    a fourth semiconductor layer forming step forming on the semiconductor substrate a fourth semiconductor layer of a second conductive type whose doping concentration is not higher than $1\times10^{17}$ cm$^{-3}$ prior to the first semiconductor layer forming step;
    the semiconductor substrate having a first conductive type,
    the first and third semiconductor layers having the second conductive type,
    the third semiconductor layer having a doping concentration of not lower than $1\times10^{18}$ cm$^{-3}$,
    the fourth semiconductor layer being exposed at least in a partial region through the etching step,
    the thin film being an electrode, and the thin film being additionally formed on the fourth semiconductor layer as well, and
    a compound layer forming step of subjecting the electrode to heat treatment after the thin film forming step to form at an interface between the electrode and the third semiconductor layer a heavily-doped side compound layer comprising at least one of the constituent elements of the electrode and at least one of the constituent elements of the third semiconductor layer, and to form at an interface between the electrode and the fourth semiconductor layer a lightly-doped side compound layer comprising at least one of the constituent elements of the electrode and at least one of the constituent elements of the fourth semiconductor layer.

4. The semiconductor device manufacturing method as claimed in claim 1, wherein etching of a side portion of the third semiconductor layer progresses while the second semiconductor layer is being etched.

* * * * *